(12) United States Patent
Yamazaki et al.

(10) Patent No.: US 12,598,864 B2
(45) Date of Patent: Apr. 7, 2026

(54) METHOD FOR MANUFACTURING DISPLAY DEVICE, DISPLAY DEVICE, DISPLAY MODULE, AND ELECTRONIC DEVICE

(71) Applicant: Semiconductor Energy Laboratory Co., Ltd., Atsugi (JP)

(72) Inventors: Shunpei Yamazaki, Setagaya (JP); Nobuharu Ohsawa, Zama (JP); Kenichi Okazaki, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 358 days.

(21) Appl. No.: 18/270,773

(22) PCT Filed: Jan. 5, 2022

(86) PCT No.: PCT/IB2022/050052
§ 371 (c)(1),
(2) Date: Jul. 3, 2023

(87) PCT Pub. No.: WO2022/153139
PCT Pub. Date: Jul. 21, 2022

(65) Prior Publication Data
US 2024/0065074 A1 Feb. 22, 2024

(30) Foreign Application Priority Data
Jan. 14, 2021 (JP) .................................. 2021-004496

(51) Int. Cl.
*H10K 59/00* (2023.01)
*H10K 50/16* (2023.01)
(Continued)

(52) U.S. Cl.
CPC ....... *H10K 59/1201* (2023.02); *H10K 50/166* (2023.02); *H10K 59/771* (2023.02); *H10K 59/35* (2023.02); *H10K 59/873* (2023.02)

(58) Field of Classification Search
CPC ............. H10K 59/1201; H10K 50/166; H10K 59/771; H10K 59/35; H10K 59/873; H10K 50/15; H05B 33/10
See application file for complete search history.

(56) References Cited

U.S. PATENT DOCUMENTS

| | | | |
|---|---|---|---|
| 5,953,985 | A | 9/1999 | Kobayashi |
| 6,120,338 | A | 9/2000 | Hirano et al. |

(Continued)

FOREIGN PATENT DOCUMENTS

| | | |
|---|---|---|
| CN | 111200068 A | 5/2020 |
| JP | 2000-036385 A | 2/2000 |

(Continued)

OTHER PUBLICATIONS

English Machine Translation of Tokunaga, JP 2018117035, (Year: 2025).*

(Continued)

*Primary Examiner* — Donald L Raleigh
(74) *Attorney, Agent, or Firm* — Eric J. Robinson; Robinson Intellectual Property Law Office, P.C.

(57) ABSTRACT

A high-resolution or high-definition display device is provided. The display device includes a first light-emitting device and a second light-emitting device. The first light-emitting device includes a first pixel electrode, a first hole-injection layer, a first hole-transport layer, a first light-emitting layer, a first electron-transport layer, a second electron-transport layer, and a common electrode that are stacked in this order. The second light-emitting device includes a second pixel electrode, a second hole-injection layer, a second hole-transport layer, a second light-emitting layer, a third electron-transport layer, a second electron-transport layer, and a common electrode that are stacked in this order. The first light-emitting device and the second light-emitting device have a function of emitting light of (Continued)

different colors from each other. The second electron-transport layer covers at least a side surface of the first pixel electrode, a side surface of the second pixel electrode, a side surface of the first light-emitting layer, and a side surface of the second light-emitting layer.

12 Claims, 17 Drawing Sheets

(51) Int. Cl.

| | | |
|---|---|---|
| *H10K 59/12* | (2023.01) | |
| *H10K 59/35* | (2023.01) | |
| *H10K 59/80* | (2023.01) | |

(56) References Cited

U.S. PATENT DOCUMENTS

| | | | |
|---|---|---|---|
| 2002/0072139 A1 | 6/2002 | Kashiwabara | |
| 2002/0105265 A1* | 8/2002 | Chuang | H10K 71/166 |
| | | | 313/506 |
| 2011/0148290 A1 | 6/2011 | Oota | |
| 2012/0256204 A1 | 10/2012 | Yoshizumi et al. | |
| 2012/0273804 A1 | 11/2012 | Hatano | |
| 2012/0276484 A1 | 11/2012 | Izumi et al. | |
| 2013/0084531 A1 | 4/2013 | Hamaguchi et al. | |
| 2013/0084664 A1 | 4/2013 | Yoshitoku et al. | |
| 2013/0084666 A1 | 4/2013 | Oshige | |
| 2013/0280839 A1 | 10/2013 | Sonoda et al. | |
| 2013/0295705 A1 | 11/2013 | Sonoda et al. | |
| 2014/0004640 A1 | 1/2014 | Hamaguchi et al. | |
| 2014/0004642 A1 | 1/2014 | Otsuka et al. | |
| 2015/0060826 A1 | 3/2015 | Matsumoto et al. | |
| 2015/0069360 A1 | 3/2015 | Sato | |
| 2015/0076476 A1 | 3/2015 | Odaka et al. | |
| 2016/0172595 A1 | 6/2016 | Malinowski et al. | |
| 2016/0315133 A1 | 10/2016 | Sato | |
| 2017/0141167 A1 | 5/2017 | Naganuma | |
| 2017/0256754 A1 | 9/2017 | Defranco et al. | |
| 2018/0190908 A1 | 7/2018 | Ke et al. | |
| 2020/0161383 A1 | 5/2020 | Kim et al. | |
| 2020/0203662 A1 | 6/2020 | Mollard et al. | |
| 2020/0210705 A1* | 7/2020 | Jeremy | G02B 27/017 |

FOREIGN PATENT DOCUMENTS

| | | | |
|---|---|---|---|
| JP | 2003-059663 A | 2/2003 | |
| JP | 2008-098106 A | 4/2008 | |
| JP | 2008-147072 A | 6/2008 | |
| JP | 2008-251270 A | 10/2008 | |
| JP | 2010-113899 A | 5/2010 | |
| JP | 2012-160473 A | 8/2012 | |
| JP | 2013-134847 A | 7/2013 | |
| JP | 2014-120218 A | 6/2014 | |
| JP | 2014-135251 A | 7/2014 | |
| JP | 2014-232568 A | 12/2014 | |
| JP | 2015-115178 A | 6/2015 | |
| JP | 2016-197494 A | 11/2016 | |
| JP | 2018117035 A | * | 7/2018 |
| JP | 2019-179696 A | 10/2019 | |
| JP | 2020-160305 A | 10/2020 | |
| KR | 2020-0057922 A | 5/2020 | |
| WO | WO-2018/087625 | 5/2018 | |

OTHER PUBLICATIONS

International Search Report (Application No. PCT/IB2022/050052) Dated Apr. 26, 2022.

Written Opinion (Application No. PCT/IB2022/050052) Dated Apr. 26, 2022.

Zakhidov.A et al., "Orthogonal processing: A new strategy for organic electronics", Chem. Sci. (Chemical Science), Apr. 7, 2011, vol. 2, No. 6, pp. 1178-1182.

Malinowski.P et al., "High resolution photolithography for direct view active matrix organic light-emitting diode augmented reality displays", J. Soc. Inf. Display (Journal of the Society for Information Display), Apr. 2, 2018, vol. 26, No. 3, pp. 128-136.

Malinowski.P et al., "Photolithographic patterning of organic photodetectors with a non-fluorinated photoresist system", Organic Electronics, Jul. 12, 2014, vol. 15, No. 10, pp. 2355-2359.

Malinowski.P et al., "Multicolor 1250 ppi OLED Arrays Patterned by Photolithography", SID Digest '16 : SID International Symposium Digest of Technical Papers, May 22, 2016, vol. 47, No. 1, pp. 1009-1012.

Papadopoulos.N et al., "AMOLED Displays with In-Pixel Photodetector", Liquid Crystals and Display Technology, Jul. 9, 2020, pp. 1-19.

Ke.T et al., "Technology Developments in High-Resolution FMM-free OLED and BEOL IGZO TFTs for Power-Efficient Microdisplays", SID Digest '21 : SID International Symposium Digest of Technical Papers, May 1, 2021, vol. 52, No. 1, pp. 127-130.

Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.

Malinowski.P et al., "Organic photolithography for displays with integrated fingerprint scanner", SID Digest '19: SID International Symposium Digest of Technical Papers, May 29, 2019, vol. 50, No. 1, pp. 1007-1010.

Ke.T et al., "Island and Hole Fabrication on OLED Stack for High-Resolution Sensor in Display Application", IDW '20 : Proceedings of the 27th International Display Workshops, Dec. 9, 2020, vol. 27, pp. 902-905.

Gather.M et al., "Solution-Processed Full-Color Polymer-OLED Displays Fabricated by Direct Photolithography", SID Digest '06 : SID International Symposium Digest of Technical Papers, Jun. 1, 2006, vol. 37, No. 1, pp. 909-911.

Malinowski.P et al., "Photolithography as Enabler of AMOLED Displays Beyond 1000 ppi", SID Digest '17 : SID International Symposium Digest of Technical Papers, May 1, 2017, vol. 48, No. 1, pp. 623-626.

* cited by examiner

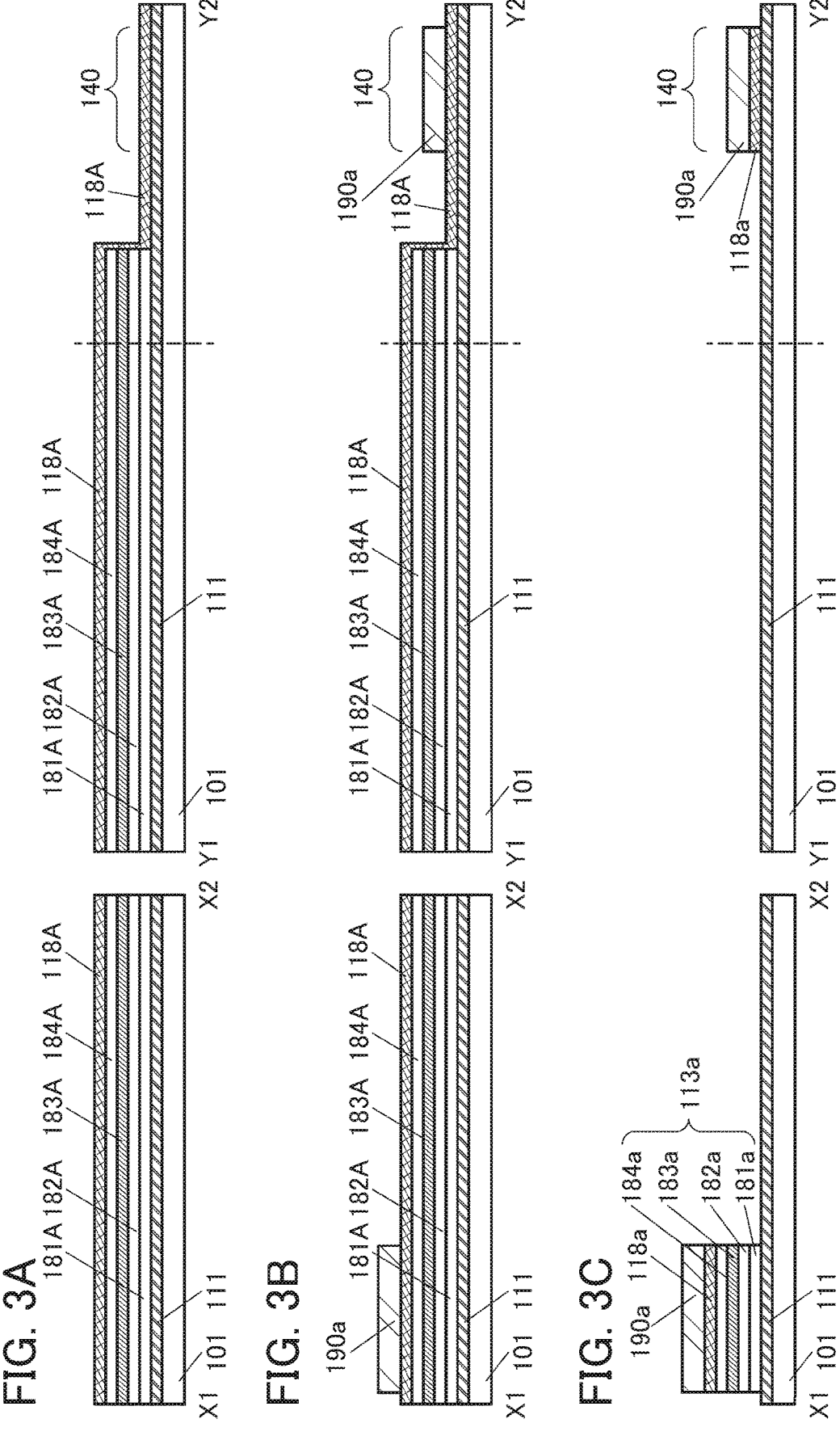

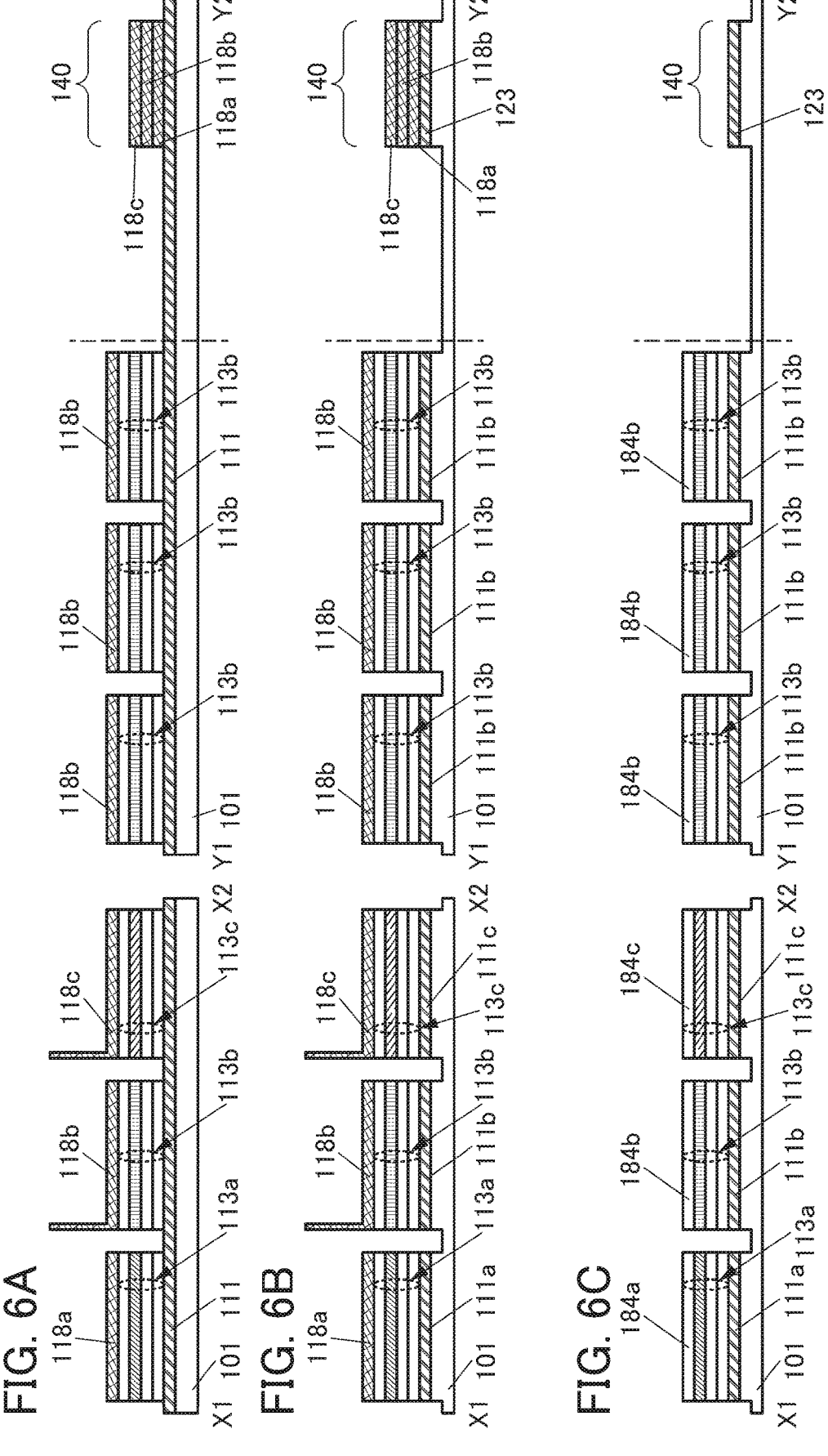

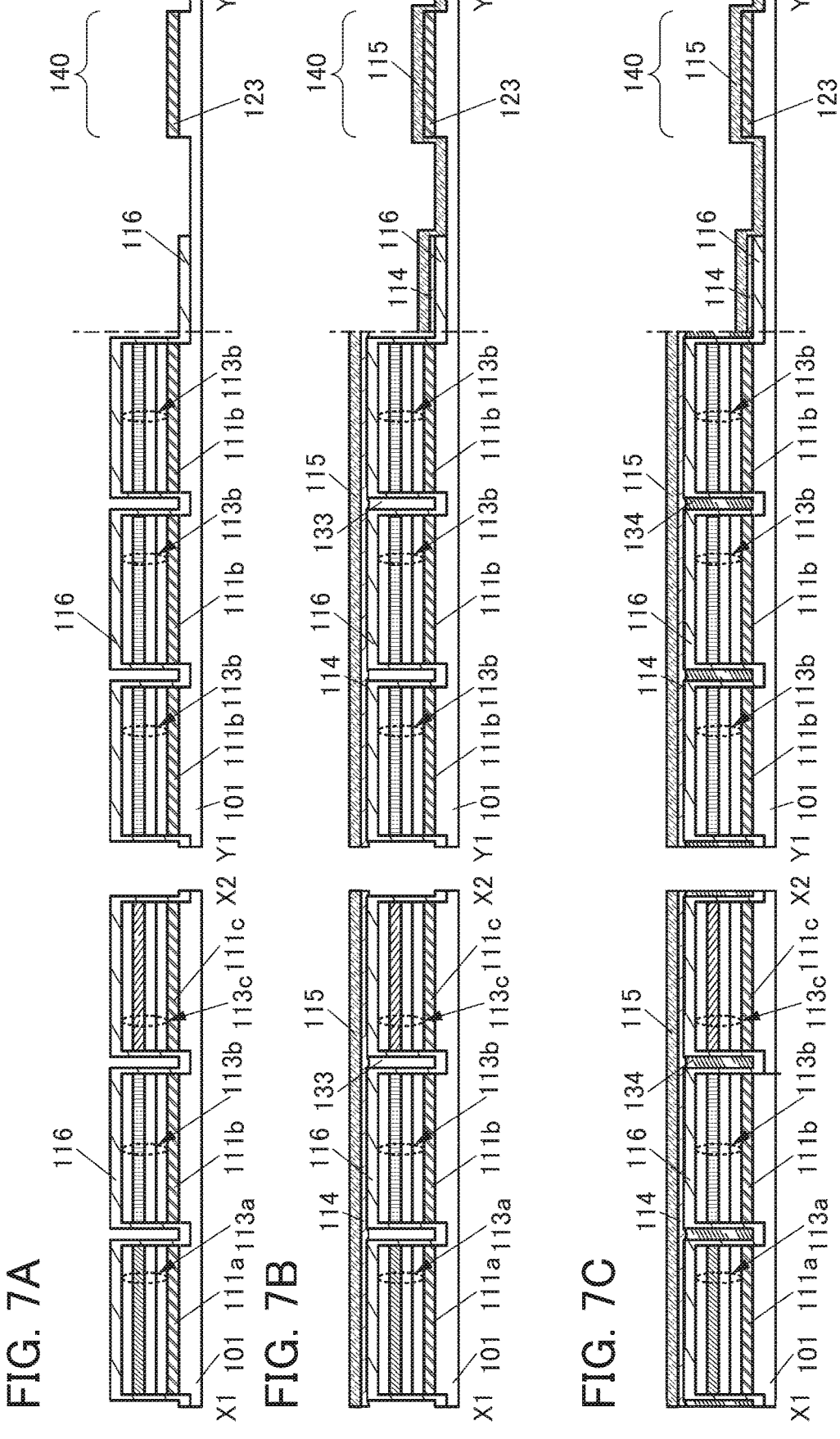

FIG. 13A
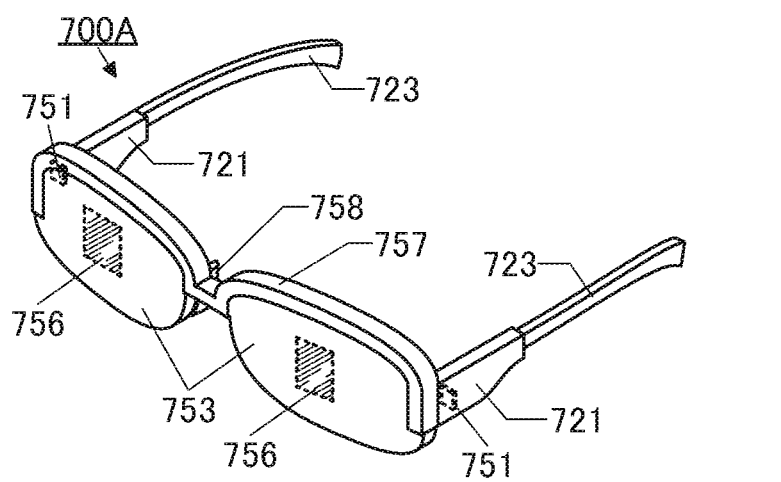
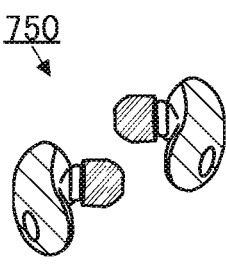
FIG. 13B
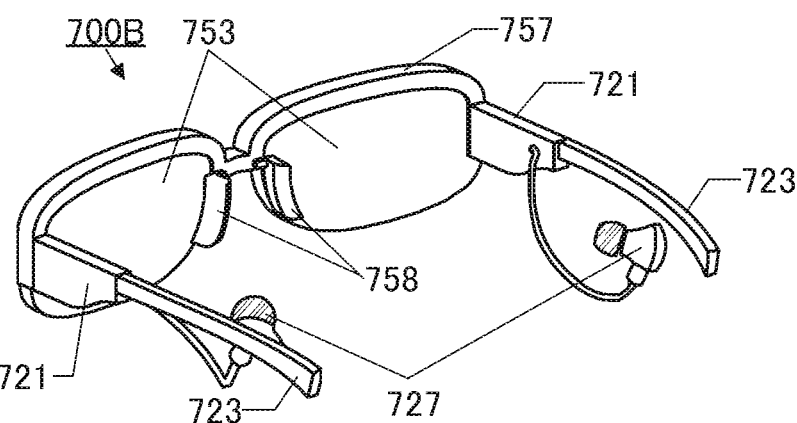

FIG. 14A
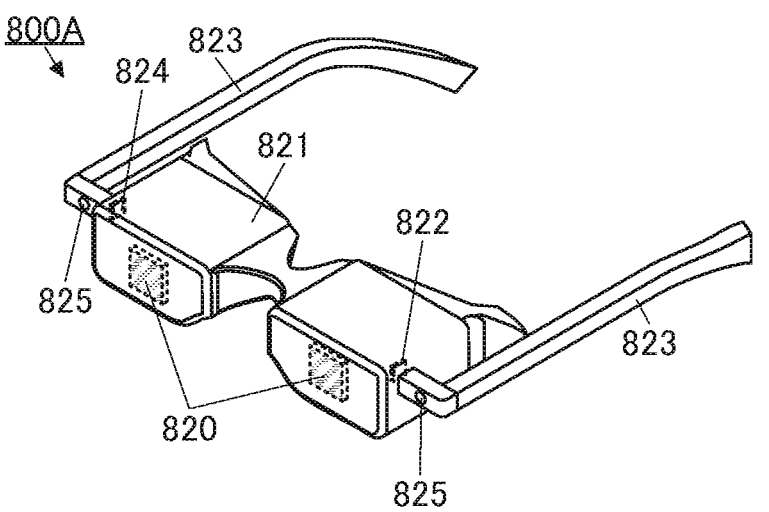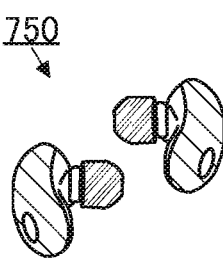
FIG. 14B
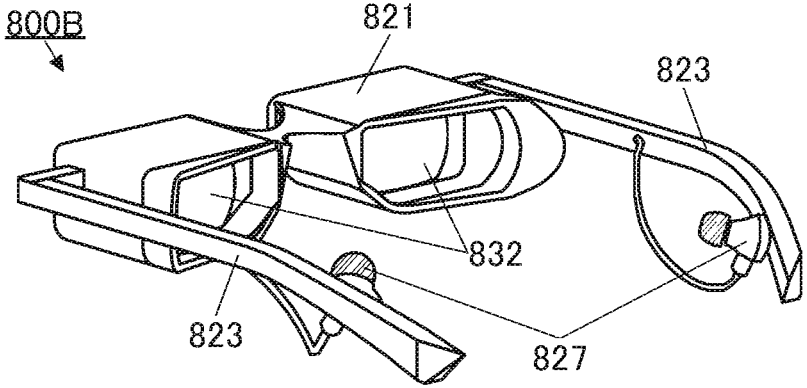

7100

7101

7000

7103

7111

7200

7211

7000

7212

7213

7214

7300

7301

7303

7000

7311

7400

7401

7000

7411

9101

9102

9200

9201

9201

9201

METHOD FOR MANUFACTURING DISPLAY DEVICE, DISPLAY DEVICE, DISPLAY MODULE, AND ELECTRONIC DEVICE

TECHNICAL FIELD

One embodiment of the present invention relates to a method for manufacturing a display device. One embodiment of the present invention relates to a display device, a display module, and an electronic device.

Note that one embodiment of the present invention is not limited to the above technical field. Examples of the technical field of one embodiment of the present invention include a semiconductor device, a display device, a light-emitting apparatus, a power storage device, a memory device, an electronic device, a lighting device, an input device (e.g., a touch sensor), an input/output device (e.g., a touch panel), a method for driving any of them, and a method for manufacturing any of them.

BACKGROUND ART

In recent years, display devices have been expected to be applied to a variety of uses. Examples of uses for a large display device include a television device for home use (also referred to as a TV or a television receiver), digital signage, and a PID (Public Information Display). In addition, a smartphone, a tablet terminal, and the like including a touch panel are being developed as portable information terminals.

Furthermore, display devices have been required to have higher resolution. For example, devices for virtual reality (VR), augmented reality (AR), substitutional reality (SR), or mixed reality (MR) are given as devices requiring high-resolution display devices and have been actively developed.

Light-emitting apparatuses including light-emitting devices (also referred to as light-emitting elements) have been developed as display devices, for example. Light-emitting devices (also referred to as EL devices or EL elements) utilizing electroluminescence (hereinafter referred to as EL) have features such as ease of reduction in thickness and weight, high-speed response to input signals, and driving with a constant DC voltage power source, and have been used in display devices.

Patent Document 1 discloses a display device using an organic EL device (also referred to as an organic EL element) for VR.

REFERENCE

Patent Document

[Patent Document 1] PCT International Publication No. 2018/087625

SUMMARY OF THE INVENTION

Problems to be Solved by the Invention

In the case of manufacturing a display device including a plurality of organic EL devices including light-emitting layers emitting light of different colors, the light-emitting layers emitting light of different colors each need to be formed into an island shape.

For example, an island-shaped light-emitting layer can be formed by a vacuum evaporation method using a metal mask (also referred to as a shadow mask). However, the outline of the layer may blur during vapor deposition, whereby the thickness of an end portion may be small. That is, the thickness of an island-shaped light-emitting layer may vary from area to area. In the case of manufacturing a display device with a large size, high definition, or high resolution, the manufacturing yield might be reduced because of low dimensional accuracy of the metal mask and deformation due to heat or the like.

In the case of manufacturing a display device by a vacuum evaporation method using a metal mask, there is a problem in that a plurality of manufacturing equipment lines are required. For example, since a metal mask needs to be cleaned regularly, at least two or more manufacturing equipment lines are prepared so that one of the equipment lines is used for device fabrication while the other equipment line is being under maintenance; in consideration of mass production, a plurality of manufacturing equipment lines are required. Thus, the issue is that the initial investment for introducing manufacturing equipment significantly increases.

An object of one embodiment of the present invention is to provide a method for manufacturing a high-resolution display device. An object of one embodiment of the present invention is to provide a method for manufacturing a high-definition display device. An object of one embodiment of the present invention is to provide a method for manufacturing a large display device. An object of one embodiment of the present invention is to provide a method for manufacturing a highly reliable display device. An object of one embodiment of the present invention is to provide a method for manufacturing a display device at a high yield.

An object of one embodiment of the present invention is to provide a high-resolution display device. An object of one embodiment of the present invention is to provide a high-definition display device. An object of one embodiment of the present invention is to provide a large display device. An object of one embodiment of the present invention is to provide a highly reliable display device.

Note that the description of these objects does not preclude the existence of other objects. One embodiment of the present invention does not need to achieve all of these objects. Other objects can be derived from the description of the specification, the drawings, and the claims.

Means for Solving the Problems

One embodiment of the present invention is a display device including a first light-emitting device and a second light-emitting device. The first light-emitting device includes a first pixel electrode, a first hole-injection layer over the first pixel electrode, a first hole-transport layer over the first hole-injection layer, a first light-emitting layer over the first hole-transport layer, a first electron-transport layer over the first light-emitting layer, a second electron-transport layer over the first electron-transport layer, an electron-injection layer over the second electron-transport layer, and a common electrode over the electron-injection layer. The second light-emitting device includes a second pixel electrode, a second hole-injection layer over the second pixel electrode, a second hole-transport layer over the second hole-injection layer, a second light-emitting layer over the second hole-transport layer, a third electron-transport layer over the second light-emitting layer, the second electron-transport layer over the third electron-transport layer, the electron-injection layer over the second electron-transport layer, and the common electrode over the electron-injection layer. The first light-emitting device and the second light-emitting device have a function of emitting light of different colors from each other. The second electron-transport layer covers at least a side surface of the first pixel electrode, a side surface of the second pixel electrode, a side surface of the first light-emitting layer, and a side surface of the second light-emitting layer.

The above display device preferably includes a protective layer over the common electrode.

The first light-emitting device and the second light-emitting device are preferably provided over an insulating layer. The insulating layer may have a recessed portion. The second electron-transport layer may be in contact with the recessed portion.

A space may be included between the second electron-transport layer and the electron-injection layer. Alternatively, an insulator may be included between the second electron-transport layer and the electron-injection layer.

One embodiment of the present invention is a display module including the display device having any of the above-described structures and is, for example, a display module provided with a connector such as a flexible printed circuit (hereinafter referred to as an FPC) or a TCP (Tape Carrier Package), or a display module on which an integrated circuit (IC) is mounted by a COG (Chip On Glass) method, a COF (Chip On Film) method, or the like.

One embodiment of the present invention is an electronic device including the above-described display module and at least one of a housing, a battery, a camera, a speaker, and a microphone.

One embodiment of the present invention is a method for manufacturing a display device, including: forming an insulating layer; forming a conductive film over the insulating layer; forming a first hole-injection layer over the conductive film; forming a first hole-transport layer over the first hole-injection layer; forming a first light-emitting layer over the first hole-transport layer; forming a first electron-transport layer over the first light-emitting layer; forming a first sacrificial layer over the first electron-transport layer; processing the first hole-injection layer, the first hole-transport layer, the first light-emitting layer, the first electron-transport layer, and the first sacrificial layer to expose part of the conductive film; forming a second hole-injection layer over the first sacrificial layer and the conductive film; forming a second hole-transport layer over the second hole-injection layer; forming a second light-emitting layer over the second hole-transport layer; forming a second electron-transport layer over the second light-emitting layer; forming a second sacrificial layer over the second electron-transport layer; processing the second hole-injection layer, the second hole-transport layer, the second light-emitting layer, the second electron-transport layer, and the second sacrificial layer to expose part of the conductive film; processing the conductive film with the first sacrificial layer and the second sacrificial layer used as a hard mask to form a first pixel electrode overlapping with the first sacrificial layer and a second pixel electrode overlapping with the second sacrificial layer; removing the first sacrificial layer and the second sacrificial layer; forming a third electron-transport layer over the first electron-transport layer and the second electron-transport layer; forming an electron-injection layer over the third electron-transport layer; and forming a common electrode over the electron-injection layer.

Furthermore, a protective layer is preferably formed over the common electrode.

In the above-described method for manufacturing a display device, the third electron-transport layer is preferably provided so as to cover at least a side surface of the first pixel electrode, a side surface of the second pixel electrode, a side surface of the first light-emitting layer, and a side surface of the second light-emitting layer.

In the above-described method for manufacturing a display device, a recessed portion of the third electron-transport layer may be filled with an insulating material before the formation of the electron-injection layer.

In the step of processing the conductive film, a recessed portion may be formed in the insulating layer.

Effect of the Invention

With one embodiment of the present invention, a method for manufacturing a high-resolution display device can be provided. With one embodiment of the present invention, a method for manufacturing a high-definition display device can be provided. With one embodiment of the present invention, a method for manufacturing a large display device can be provided. With one embodiment of the present invention, a method for manufacturing a highly reliable display device can be provided. With one embodiment of the present invention, a method for manufacturing a display device at a high yield can be provided.

With one embodiment of the present invention, a high-resolution display device can be provided. With one embodiment of the present invention, a high-definition display device can be provided. With one embodiment of the present invention, a large display device can be provided. With one embodiment of the present invention, a highly reliable display device can be provided.

Note that the description of these effects does not preclude the existence of other effects. One embodiment of the present invention does not need to have all of these effects. Other effects can be derived from the description of the specification, the drawings, and the claims.

BRIEF DESCRIPTION OF THE DRAWINGS

FIG. 3A to FIG. 3C are cross-sectional views illustrating an example of a method for manufacturing a display device.

FIG. 4A to FIG. 4C are cross-sectional views illustrating an example of the method for manufacturing a display device.

FIG. 5A to FIG. 5C are cross-sectional views illustrating an example of the method for manufacturing a display device.

FIG. 6A to FIG. 6C are cross-sectional views illustrating an example of the method for manufacturing a display device.

FIG. 7A to FIG. 7C are cross-sectional views illustrating an example of the method for manufacturing a display device.

FIG. 13A and FIG. 13B are diagrams each illustrating an example of an electronic device.

FIG. 14A and FIG. 14B are diagrams each illustrating an example of an electronic device.

MODE FOR CARRYING OUT THE INVENTION

Figure 1A:
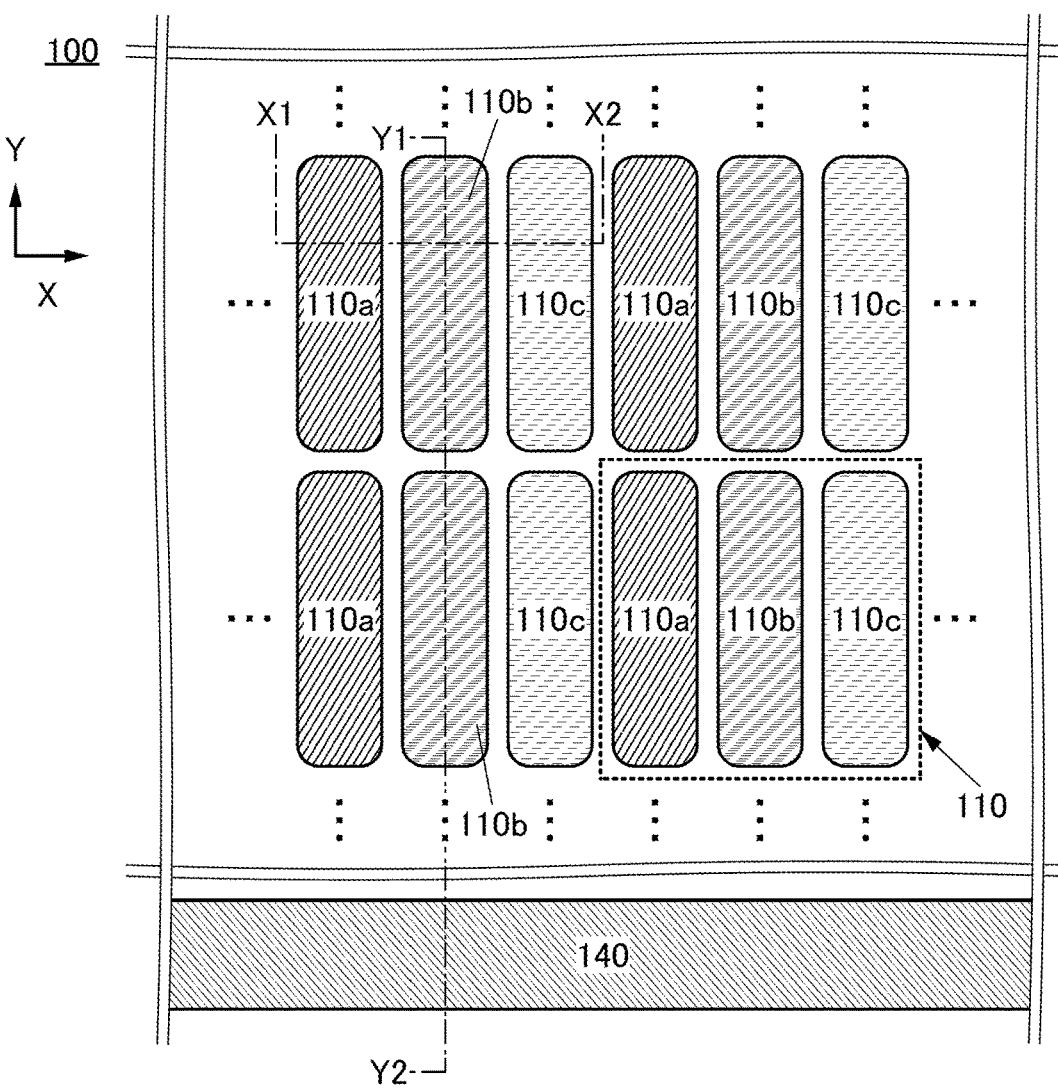
FIG. 1A is a top view illustrating an example of a display device.

Embodiments are described in detail with reference to the drawings. Note that the present invention is not limited to the following description, and it will be readily appreciated by those skilled in the art that modes and details of the present invention can be modified in various ways without departing from the spirit and scope of the present invention. Therefore, the present invention should not be construed as being limited to the description in the following embodiments.

Note that in structures of the invention described below, the same portions or portions having similar functions are denoted by the same reference numerals in different drawings, and the description thereof is not repeated. Furthermore, the same hatching pattern is used for the portions having similar functions, and the portions are not especially denoted by reference numerals in some cases.

The position, size, range, or the like of each component illustrated in drawings does not represent the actual position, size, range, or the like in some cases for easy understanding. Therefore, the disclosed invention is not necessarily limited to the position, size, range, or the like disclosed in the drawings.

Note that in this specification and the like, ordinal numbers such as "first" and "second" are used for convenience and do not limit the number of components or the order of components (e.g., the order of steps or the stacking order of layers). An ordinal number used for a component in a certain part in this specification is not the same as an ordinal number used for the component in another part in this specification or claims in some cases. The term "film" and the term "layer" can be interchanged with each other depending on the case or circumstances. For example, the term "conductive layer" can be replaced with the term "conductive film". As another example, the term "insulating film" can be replaced with the term "insulating layer".

In this specification and the like, a device formed using a metal mask or an FMM (a fine metal mask, a high-resolution metal mask) may be referred to as a device having an MM (metal mask) structure. In this specification and the like, a device formed without using a metal mask or an FMM may be referred to as a device having an MML (metal maskless) structure.

Embodiment 1

In this embodiment, a display device of one embodiment of the present invention and a manufacturing method thereof are described with reference to FIG. 1 to FIG. 7.

In a method for manufacturing a display device of one embodiment of the present invention, a conductive film is formed, a first layer (also referred to as an EL layer or part of an EL layer) including a light-emitting layer emitting light of a first color is formed over the entire surface, and then a first sacrificial layer is formed over the first layer. Then, a first resist mask is formed over the first sacrificial layer and the first layer and the first sacrificial layer are processed using the first resist mask, whereby the first layer is formed into an island shape. Next, in a manner similar to that for the first layer, a second layer (also referred to as an EL layer or part of an EL layer) including a light-emitting layer emitting light of a second color is processed into an island shape using a second sacrificial layer and a second resist mask.

As described above, in the method for manufacturing a display device of one embodiment of the present invention, the island-shaped EL layers are formed not by using a fine metal mask but by processing an EL layer deposited over the entire surface; thus, the island-shaped EL layers can be formed to have a uniform thickness. In addition, the sacrificial layers provided over the EL layers can reduce damage to the EL layers during the manufacturing process of the display device, increasing the reliability of a light-emitting device.

After the EL layers emitting light of the respective colors are formed, the conductive film is processed with the sacrificial layers remaining over the EL layers used as a hard mask, whereby pixel electrodes can be formed. A mask for forming island-shaped pixel electrodes does not need to be provided additionally, reducing the manufacturing costs of the display device. Furthermore, an insulating layer covering end portions of the pixel electrodes does not need to be provided between the pixel electrodes and the EL layers, so that the distance between adjacent light-emitting devices can be extremely narrowed. As a result, higher resolution or higher definition of the display device can be achieved.

Here, each of the first layer and the second layer includes at least a light-emitting layer and preferably consists of a plurality of layers. Specifically, one or more layers are preferably formed over the light-emitting layer. A layer between the light-emitting layer and the sacrificial layer can inhibit the light-emitting layer from being exposed on the outermost surface during the manufacturing process of the display device and can reduce damage to the light-emitting layer. Accordingly, the reliability of the light-emitting device can be increased. Thus, the first layer and the second layer each preferably include the light-emitting layer and a carrier-transport layer over the light-emitting layer.

Note that it is not necessary to form all layers included in the EL layers separately between the light-emitting devices emitting light of different colors from each other, and some layers of the EL layers can be formed in the same step. In the method for manufacturing a display device of one embodiment of the present invention, after some layers included in the EL layers are formed into an island shape separately for each color, the sacrificial layer is removed and then other layers included in the EL layers and a common electrode (also referred to as an upper electrode) are formed so as to be shared by the light-emitting devices of the respective colors. For example, a carrier-injection layer and a common electrode can be formed so as to be shared by the light-emitting devices of the respective colors. Meanwhile, the carrier-injection layer is often a layer having relatively high conductivity in the EL layers. Therefore, when the carrier-injection layer is in contact with a side surface of any layer of the EL layers formed into an island shape or a side surface of the pixel electrode, the light-emitting device might be short-circuited. Note that also in the case where the carrier-injection layer is formed into an island shape and the common electrode is formed to be shared by the light-emitting devices of the respective colors, the light-emitting device might be short-circuited when the common electrode is in contact with the side surface of the EL layer or the side surface of the pixel electrode.

In view of the above, in the display device of one embodiment of the present invention, two layers of an island-shaped first carrier-transport layer and a second carrier-transport layer shared by the light-emitting devices of the respective colors are provided between an island-shaped light-emitting layer and a carrier-injection layer shared by the light-emitting devices of the respective colors.

This can inhibit some layers of the island-shaped EL layers and the pixel electrodes from being in contact with the carrier-injection layer. Thus, a short circuit in the light-emitting device is inhibited, and the reliability of the light-emitting device can be improved.

The display device of one embodiment of the present invention includes a pixel electrode functioning as an anode; an island-shaped hole-injection layer, an island-shaped hole-transport layer, an island-shaped light-emitting layer, and an island-shaped first electron-transport layer that are provided in this order over the pixel electrode; a second electron-transport layer provided to cover the pixel electrode, the hole-injection layer, the hole-transport layer, the light-emitting layer, and the first electron-transport layer; an electron-injection layer provided over the second electron-transport layer; and a common electrode that is provided over the electron-injection layer and functions as a cathode.

Alternatively, the display device of one embodiment of the present invention includes a pixel electrode functioning as a cathode; an island-shaped electron-injection layer, an island-shaped electron-transport layer, an island-shaped light-emitting layer, and an island-shaped first hole-transport layer that are provided in this order over the pixel electrode; a second hole-transport layer provided to cover the pixel electrode, the electron-injection layer, the electron-transport layer, the light-emitting layer, and the first hole-transport layer; a hole-injection layer provided over the second hole-transport layer; and a common electrode that is provided over the hole-injection layer and functions as an anode.

With such a structure, a highly reliable display device with high resolution or high definition can be manufactured.

[Structure Example of Display Device]

Figure 1B:
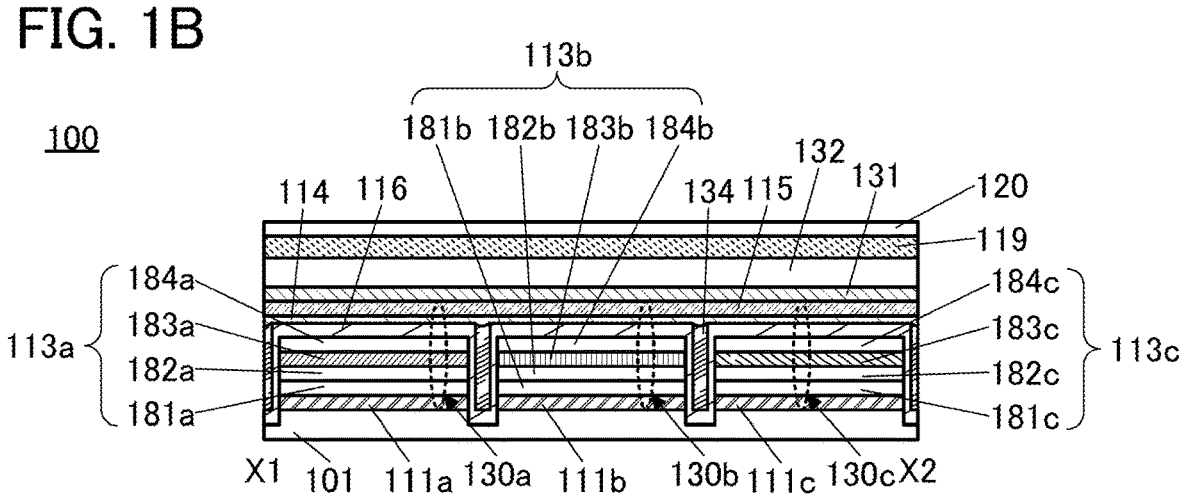
FIG. 1B is a cross-sectional view illustrating an example of the display device.

FIG. 1A and FIG. 1B illustrate a display device of one embodiment of the present invention.

FIG. 1A illustrates a top view of a display device 100. The display device 100 includes a display portion in which a plurality of pixels 110 are arranged in a matrix, and a connection portion 140 outside the display portion. Each of the pixels 110 consists of three subpixels 110a, 110b, and 110c. The connection portion 140 can also be referred to as a cathode contact portion.

The top surface shapes of the subpixels illustrated in FIG. 1A correspond to the top surface shapes of light-emitting regions.

The range of the circuit layout for forming the subpixels is not limited to the range of the subpixels illustrated in FIG. 1A and may be placed outside the subpixels. For example, transistors included in the subpixel 110a may be positioned within the range of the subpixel 110b illustrated in FIG. 1A, or some or all of the transistors may be positioned outside the range of the subpixel 110a.

Although the subpixels 110a, 110b, and 110c have the same or substantially the same aperture ratio (also referred to as size or size of a light-emitting region) in FIG. 1A, one embodiment of the present invention is not limited thereto. The aperture ratio of each of the subpixels 110a, 110b, and 110c can be determined as appropriate. The subpixels 110a, 110b, and 110c may have different aperture ratios, or two or more of the subpixels 110a, 110b, and 110c may have the same or substantially the same aperture ratio.

FIG. 1A illustrates an example in which subpixels of different colors are aligned in the X direction and subpixels of the same color are aligned in the Y direction. Note that subpixels of different colors may be aligned in the Y direction, and subpixels of the same color may be aligned in the X direction.

Although the top view of FIG. 1A illustrates an example in which the connection portion 140 is positioned in the lower side of the display portion, one embodiment of the present invention is not limited thereto. The connection portion 140 only needs to be provided in at least one of the upper side, the right side, the left side, and the lower side of the display portion in the top view, or may be provided so as to surround the four sides of the display portion.

FIG. 1B is a cross-sectional view taken along the dashed-dotted line X1-X2 in FIG. 1A.

As illustrated in FIG. 1B, in the display device 100, light-emitting devices 130a, 130b, and 130c are provided over a layer 101 including transistors and protective layers 131 and 132 are provided to cover these light-emitting devices. A substrate 120 is bonded to the protective layer 132 with a resin layer 119.

The display device of one embodiment of the present invention can have any of the following structures: a top-emission structure in which light is emitted in a direction opposite to the substrate where the light-emitting device is formed, a bottom-emission structure in which light is emitted toward the substrate where the light-emitting device is formed, and a dual-emission structure in which light is emitted toward both surfaces.

The layer 101 including transistors can employ a stacked-layer structure in which a plurality of transistors are provided over a substrate and an insulating layer is provided to cover these transistors, for example. The layer 101 including transistors may have a recessed portion between adjacent light-emitting devices. For example, an insulating layer positioned on the outermost surface of the layer 101 including transistors may have a recessed portion. Structure examples of the layer 101 including transistors will be described in Embodiment 2.

The light-emitting devices 130a, 130b, and 130c emit light of different colors from each other. Preferably, the light-emitting devices 130a, 130b, and 130c emit light of three colors, red (R), green (G), and blue (B), for example.

Each of the light-emitting devices includes an EL layer between a pair of electrodes. In this specification and the like, one of the pair of electrodes may be referred to as a pixel electrode and the other may be referred to as a common electrode.

One of the pair of electrodes of the light-emitting device functions as an anode, and the other electrode functions as a cathode. Hereinafter, the case where the pixel electrode functions as an anode and the common electrode functions as a cathode is described as an example.

The light-emitting device 130a includes a pixel electrode 111a over the layer 101 including transistors, an island-shaped first layer 113a over the pixel electrode 111a, a fourth electron-transport layer 116 covering a top surface and a side surface of the island-shaped first layer 113a, an electron-injection layer 114 over the fourth electron-transport layer 116, and a common electrode 115 over the electron-injection layer 114. The first layer 113a includes a first hole-injection layer 181a over the pixel electrode 111a, a first hole-transport layer 182a over the first hole-injection layer 181a, a first light-emitting layer 183a over the first hole-transport layer 182a, and a first electron-transport layer 184a over the first light-emitting layer 183a. In the light-emitting device 130a, the first layer 113a, the fourth electron-transport layer 116, and the electron-injection layer 114 can be collectively referred to as an EL layer.

The light-emitting device 130b includes a pixel electrode 111b over the layer 101 including transistors, an island-shaped second layer 113b over the pixel electrode 111b, the fourth electron-transport layer 116 covering a top surface and a side surface of the island-shaped second layer 113b, the electron-injection layer 114 over the fourth electron-transport layer 116, and the common electrode 115 over the electron-injection layer 114. The second layer 113b includes a second hole-injection layer 181b over the pixel electrode 111b, a second hole-transport layer 182b over the second hole-injection layer 181b, a second light-emitting layer 183b over the second hole-transport layer 182b, and a second electron-transport layer 184b over the second light-emitting layer 183b. In the light-emitting device 130b, the second layer 113b, the fourth electron-transport layer 116, and the electron-injection layer 114 can be collectively referred to as an EL layer.

The light-emitting device 130c includes a pixel electrode 111c over the layer 101 including transistors, an island-shaped third layer 113c over the pixel electrode 111c, the fourth electron-transport layer 116 covering a top surface and a side surface of the island-shaped third layer 113c, the electron-injection layer 114 over the fourth electron-transport layer 116, and the common electrode 115 over the electron-injection layer 114. The third layer 113c includes a third hole-injection layer 181c over the pixel electrode 111c, a third hole-transport layer 182c over the third hole-injection layer 181c, a third light-emitting layer 183c over the third hole-transport layer 182c, and a third electron-transport layer 184c over the third light-emitting layer 183c. In the light-emitting device 130c, the third layer 113c, the fourth electron-transport layer 116, and the electron-injection layer 114 can be collectively referred to as an EL layer.

The common electrode shared by the light-emitting devices of the respective colors is electrically connected to a conductive layer provided in the connection portion 140.

A conductive film that transmits visible light is used as the electrode through which light is extracted among the pixel electrode and the common electrode. A conductive film that reflects visible light is preferably used as the electrode through which light is not extracted.

As a material that forms the pair of electrodes (the pixel electrode and the common electrode) of the light-emitting device, a metal, an alloy, an electrically conductive compound, a mixture thereof, and the like can be used as appropriate. Specific examples include indium tin oxide (In—Sn oxide, also referred to as ITO), In—Si—Sn oxide (also referred to as ITSO), indium zinc oxide (In—Zn oxide), In—W—Zn oxide, an alloy containing aluminum (an aluminum alloy) such as an alloy of aluminum, nickel, and lanthanum (Al—Ni—La), and an alloy of silver, palladium, and copper (Ag—Pd—Cu, also referred to as APC). In addition, it is possible to use a metal such as aluminum (Al), titanium (Ti), chromium (Cr), manganese (Mn), iron (Fe), cobalt (Co), nickel (Ni), copper (Cu), gallium (Ga), zinc (Zn), indium (In), tin (Sn), molybdenum (Mo), tantalum (Ta), tungsten (W), palladium (Pd), gold (Au), platinum (Pt), silver (Ag), yttrium (Y), or neodymium (Nd) and an alloy containing an appropriate combination of any of these metals. It is also possible to use an element belonging to Group 1 or Group 2 of the periodic table, which is not described above (e.g., lithium (Li), cesium (Cs), calcium (Ca), or strontium (Sr)), a rare earth metal such as europium (Eu) or ytterbium (Yb), an alloy containing an appropriate combination of any of these, graphene, or the like.

The light-emitting devices preferably employ a microcavity structure. Therefore, one of the pair of electrodes of the light-emitting devices is preferably an electrode having properties of transmitting and reflecting visible light (a semi-transmissive and semi-reflective electrode), and the other is preferably an electrode having a property of reflecting visible light (a reflective electrode). When the light-emitting devices have a microcavity structure, light obtained from the light-emitting layers can be resonated between the electrodes, whereby light emitted from the light-emitting devices can be intensified.

Note that the semi-transmissive and semi-reflective electrode can have a stacked-layer structure of a reflective electrode and an electrode having a property of transmitting visible light (also referred to as a transparent electrode).

The transparent electrode has a light transmittance higher than or equal to 40%. For example, an electrode having a visible light (light with a wavelength greater than or equal to 400 nm and less than 750 nm) transmittance higher than or equal to 40% is preferably used in the light-emitting devices. The semi-transmissive and semi-reflective electrode has a visible light reflectance of higher than or equal to 10% and lower than or equal to 95%, preferably higher than or equal to 30% and lower than or equal to 80%. The reflective electrode has a visible light reflectance of higher than or equal to 40% and lower than or equal to 100%, preferably higher than or equal to 70% and lower than or equal to 100%. These electrodes preferably have a resistivity lower than or equal to $1 \times 10^{-2}$ Ωcm.

The first layer 113a, the second layer 113b, and the third layer 113c are each provided in an island shape. The first layer 113a, the second layer 113b, and the third layer 113c each include a light-emitting layer. The first layer 113a, the second layer 113b, and the third layer 113c preferably include light-emitting layers that emit different colors from each other.

The light-emitting layer is a layer containing a light-emitting substance. The light-emitting layer can contain one or more kinds of light-emitting substances. As the light-emitting substance, a substance that exhibits an emission color of blue, purple, bluish purple, green, yellowish green, yellow, orange, red, or the like is appropriately used. A substance that emits near-infrared light can also be used as the light-emitting substance.

Examples of the light-emitting substance include a fluorescent material, a phosphorescent material, a thermally activated delayed fluorescence (TADF) material, and a quantum dot material.

Examples of the fluorescent material include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of the phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton; an organometallic complex (particularly an iridium complex) having a phenylpyridine derivative including an electron-withdrawing group as a ligand; a platinum complex; and a rare earth metal complex.

The light-emitting layer may contain one or more kinds of organic compounds (e.g., a host material and an assist material) in addition to the light-emitting substance (a guest material). As one or more kinds of organic compounds, one or both of the hole-transport material and the electron-transport material can be used. As one or more kinds of organic compounds, a bipolar material or a TADF material may be used.

The light-emitting layer preferably includes, for example, a phosphorescent material and a combination of a hole-transport material and an electron-transport material that easily forms an exciplex. With such a structure, light emission can be efficiently obtained by ExTET (Exciplex—Triplet Energy Transfer), which is energy transfer from an exciplex to a light-emitting substance (a phosphorescent material). When a combination of materials is selected so as to form an exciplex that exhibits light emission whose wavelength overlaps with the wavelength of a lowest-energy-side absorption band of the light-emitting substance, energy can be smoothly transferred and light emission can be efficiently obtained. With this structure, high efficiency, low-voltage driving, and a long lifetime of the light-emitting device can be achieved at the same time.

In addition to the light-emitting layer, the first layer 113a, the second layer 113b, and the third layer 113c may further include layers containing a substance with a high hole-injection property, a substance with a high hole-transport property, a hole-blocking material, a substance with a high electron-transport property, a substance with a high electron-injection property, an electron-blocking material, a substance with a bipolar property (a substance with a high electron-transport property and a high hole-transport property), and the like.

Either a low molecular compound or a high molecular compound can be used for the light-emitting device, and an inorganic compound may also be included. Each of the layers included in the light-emitting device can be formed by an evaporation method (including a vacuum evaporation method), a transfer method, a printing method, an ink-jet method, a coating method, or the like.

For example, the first layer 113a, the second layer 113b, and the third layer 113c may each include one or more of a hole-injection layer, a hole-transport layer, a hole-blocking layer, an electron-blocking layer, an electron-transport layer, and an electron-injection layer.

In the EL layer, one or more of a hole-injection layer, a hole-transport layer, a hole-blocking layer, an electron-blocking layer, an electron-transport layer, and an electron-injection layer can be formed as a layer common to the light-emitting devices of the respective colors.

In the display device 100 illustrated in FIG. 1B, the first layer 113a includes the first light-emitting layer 183a and the first electron-transport layer 184a over the first light-emitting layer 183a. Similarly, the second layer 113b includes the second light-emitting layer 183b and the second electron-transport layer 184b over the second light-emitting layer 183b, and the third layer 113c includes the third light-emitting layer 183c and the third electron-transport layer 184c over the third light-emitting layer 183c. Accordingly, the light-emitting layer is inhibited from being exposed on the outermost surface during the manufacturing process of the display device 100, so that damage to the light-emitting layer can be reduced. As a result, the reliability of the light-emitting device can be increased.

The first layer 113a, the second layer 113b, and the third layer 113c are covered with the fourth electron-transport layer 116, and the electron-injection layer 114 and the common electrode 115 are provided over the fourth electron-transport layer 116. This inhibits the electron-injection layer 114 or the common electrode 115 from being in contact with a side surface of any of the pixel electrodes 111a, 111b, and 111c, the first layer 113a, the second layer 113b, and the third layer 113c, thereby inhibiting a short circuit in the light-emitting device.

The hole-injection layer is a layer injecting holes from an anode to a hole-transport layer, and a layer containing a material with a high hole-injection property. Examples of the material with a high hole-injection property include an aromatic amine compound and a composite material containing a hole-transport material and an acceptor material (electron-accepting material).

The hole-transport layer is a layer transporting holes, which are injected from an anode by a hole-injection layer, to a light-emitting layer. The hole-transport layer is a layer containing a hole-transport material. As the hole-transport material, a substance having a hole mobility greater than or equal to $1 \times 10^{-6}$ cm$^2$/Vs is preferable. Note that other substances can also be used as long as they have a property of transporting more holes than electrons. As the hole-transport material, materials having a high hole-transport property, such as a π-electron rich heteroaromatic compound (e.g., a carbazole derivative, a thiophene derivative, and a furan derivative) and an aromatic amine (a compound having an aromatic amine skeleton), are preferable.

The electron-transport layer is a layer that transports electrons, which are injected from a cathode by an electron-injection layer, to a light-emitting layer. The electron-transport layer is a layer containing an electron-transport material. As the electron-transport material, a substance having an electron mobility greater than or equal to $1 \times 10^{-6}$ cm$^2$/Vs is preferable. Note that other substances can also be used as long as they have a property of transporting more electrons than holes. As the electron-transport material, it is possible to use a material having a high electron-transport property, such as a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, or a π-electron deficient heteroaromatic compound such as a nitrogen-containing heteroaromatic compound.

The electron-injection layer is a layer injecting electrons from a cathode to the electron-transport layer, and a layer containing a material with a high electron-injection property. As the material with a high electron-injection property, an alkali metal, an alkaline earth metal, or a compound thereof can be used. As the material with a high electron-injection property, a composite material containing an electron-transport material and a donor material (electron-donating material) can also be used.

As the electron-injection layer, for example, an alkali metal, an alkaline earth metal, or a compound thereof, such as lithium, cesium, lithium fluoride (LiF), cesium fluoride (CsF), calcium fluoride (CaF$_2$), 8-(quinolinolato)lithium (abbreviation: Liq), 2-(2-pyridyl)phenolatolithium (abbreviation: LiPP), 2-(2-pyridyl)-3-pyridinolatolithium (abbreviation: LiPPy), 4-phenyl-2-(2-pyridyl)phenolatolithium (abbreviation: LiPPP), lithium oxide (Lia$_x$), or cesium carbonate can be used.

Alternatively, an electron-transport material may be used for the electron-injection layer. For example, a compound having an unshared electron pair and having an electron deficient heteroaromatic ring can be used as the electron-transport material. Specifically, a compound with at least one of a pyridine ring, a diazine ring (a pyrimidine ring, a pyrazine ring, and a pyridazine ring), and a triazine ring can be used.

Note that the lowest unoccupied molecular orbital (LUMO) of the organic compound having an unshared electron pair is preferably greater than or equal to −3.6 eV and less than or equal to −2.3 eV. In general, the highest occupied molecular orbital (HOMO) level and the LUMO level of an organic compound can be estimated by CV (cyclic voltammetry), photoelectron spectroscopy, optical absorption spectroscopy, inverse photoelectron spectroscopy, or the like.

For example, 4,7-diphenyl-1,10-phenanthroline (abbreviation: BPhen), 2,9-bis(naphthalen-2-yl)-4,7-diphenyl-1,10-phenanthroline (abbreviation: NBPhen), diquinoxalino[2,3-a: 2',3'-c]phenazine (abbreviation: HATNA), or 2,4,6-tris[3'-(pyridin-3-yl)biphenyl-3-yl]-1,3,5-triazine (abbreviation: TmPPPyTz) can be used as the organic compound having an unshared electron pair. Note that NBPhen has a higher glass transition temperature (Tg) than BPhen and thus has high heat resistance.

The protective layers 131 and 132 are preferably provided over the light-emitting devices 130a, 130b, and 130c. Providing the protective layers 131 and 132 can improve the reliability of the light-emitting devices.

There is no limitation on the conductivity of the protective layers 131 and 132. As the protective layers 131 and 132, at least one type of insulating films, semiconductor films, and conductive films can be used.

The protective layers 131 and 132 including inorganic films can inhibit deterioration of the light-emitting devices by preventing oxidation of the common electrode 115 and inhibiting entry of impurities (e.g., moisture and oxygen) into the light-emitting devices 130a, 130b, and 130c, for example; thus, the reliability of the display device can be improved.

As the protective layers 131 and 132, an inorganic insulating film such as an oxide insulating film, a nitride insulating film, an oxynitride insulating film, or a nitride oxide insulating film can be used, for example. Examples of the oxide insulating film include a silicon oxide film, an aluminum oxide film, a gallium oxide film, a germanium oxide film, an yttrium oxide film, a zirconium oxide film, a lanthanum oxide film, a neodymium oxide film, a hafnium oxide film, and a tantalum oxide film. Examples of the nitride insulating film include a silicon nitride film and an aluminum nitride film. Examples of the oxynitride insulating film include a silicon oxynitride film and an aluminum oxynitride film. Examples of the nitride oxide insulating film include a silicon nitride oxide film and an aluminum nitride oxide film.

Note that in this specification and the like, oxynitride refers to a material that contains more oxygen than nitrogen, and nitride oxide refers to a material that contains more nitrogen than oxygen.

Each of the protective layers 131 and 132 preferably includes a nitride insulating film or a nitride oxide insulating film, and further preferably includes a nitride insulating film.

As the protective layers 131 and 132, an inorganic film containing In—Sn oxide (also referred to as ITO), In—Zn oxide, Ga—Zn oxide, Al—Zn oxide, indium gallium zinc oxide (In—Ga—Zn oxide, also referred to as IGZO), or the like can also be used. The inorganic film preferably has high resistance, specifically, higher resistance than the common electrode 115. The inorganic film may further contain nitrogen.

When light emitted from the light-emitting device is extracted through the protective layers 131 and 132, the protective layers 131 and 132 preferably have a high visible-light-transmitting property. For example, ITO, IGZO, and aluminum oxide are preferable because they are inorganic materials having a high visible-light-transmitting property.

The protective layers 131 and 132 can have, for example, a stacked-layer structure of an aluminum oxide film and a silicon nitride film over the aluminum oxide film, or a stacked-layer structure of an aluminum oxide film and an IGZO film over the aluminum oxide film. Such a stacked-layer structure can inhibit entry of impurities (e.g., water and oxygen) into the EL layer.

Furthermore, the protective layers 131 and 132 may each include an organic film. For example, the protective layer 132 may include both an organic film and an inorganic film.

The protective layer 131 and the protective layer 132 may be formed by different deposition methods. Specifically, the protective layer 131 and the protective layer 132 may be formed by an atomic layer deposition (ALD) method and a sputtering method, respectively.

End portions of the pixel electrodes 111a, 111b, and 111c are not covered with an insulating layer. This allows the distance between adjacent light-emitting devices to be extremely narrowed. As a result, the display device can have high resolution or high definition.

In the display device of this embodiment, the light-emitting devices are provided with the island-shaped light-emitting layers of their respective colors, and the display device is manufactured by what is called a separate coloring method (SBS (Side By Side) method). Thus, the display device can have higher light extraction efficiency compared with a structure in which a white-light-emitting device and color filters are combined. Furthermore, since a light-emitting device with a single structure can be used, the driving voltage of the display device can be lower than that of a display device having a structure using a tandem light-emitting device. The SBS method also achieves a display device with lower power consumption than that using a structure in which a white-light-emitting device and color filters are combined or a structure using a tandem light-emitting device.

In the display device of this embodiment, the distance between the light-emitting devices can be narrowed. Specifically, the distance between the light-emitting devices can be less than or equal to 1 μm, preferably less than or equal to 500 nm, further preferably less than or equal to 200 nm, less than or equal to 100 nm, less than or equal to 90 nm, less than or equal to 70 nm, less than or equal to 50 nm, less than or equal to 30 nm, less than or equal to 20 nm, less than or equal to 15 nm, or less than or equal to 10 nm. In other words, the display device includes a region where the distance between a side surface of the first layer 113a and a side surface of the second layer 113b or the distance between a side surface of the second layer 113b and a side surface of the third layer 113c is less than or equal to 1 μm, preferably less than or equal to 0.5 μm (500 nm), further preferably less than or equal to 100 nm.

A light-blocking layer may be provided on the surface of the substrate 120 on the resin layer 119 side. A variety of optical members can be arranged on the outer surface of the substrate 120. Examples of the optical members include a polarizing plate, a retardation plate, a light diffusion layer (e.g., a diffusion film), an anti-reflective layer, and a light-condensing film. Furthermore, an antistatic film inhibiting the attachment of dust, a water repellent film suppressing the attachment of stain, a hard coat film inhibiting generation of a scratch caused by the use, an impact-absorbing layer, or the like may be arranged on the outer surface of the substrate 120.

For the substrate 120, glass, quartz, ceramics, sapphire, a resin, a metal, an alloy, a semiconductor, or the like can be used. The substrate on the side from which light from the light-emitting device is extracted is formed using a material that transmits the light. When the substrate 120 is formed using a flexible material, the flexibility of the display device can be increased and a flexible display can be achieved. Furthermore, a polarizing plate may be used as the substrate 120.

For the substrate 120, any of the following can be used: polyester resins such as polyethylene terephthalate (PET) and polyethylene naphthalate (PEN), a polyacrylonitrile resin, an acrylic resin, a polyimide resin, a polymethyl methacrylate resin, a polycarbonate (PC) resin, a polyether-sulfone (PES) resin, polyamide resins (e.g., nylon and aramid), a polysiloxane resin, a cycloolefin resin, a poly-styrene resin, a polyamide-imide resin, a polyurethane resin, a polyvinyl chloride resin, a polyvinylidene chloride resin, a polypropylene resin, a polytetrafluoroethylene (PTFE) resin, an ABS resin, and cellulose nanofiber. Glass that is thin enough to have flexibility may be used for the substrate 120.

In the case where a circularly polarizing plate overlaps with the display device, a highly optically isotropic substrate is preferably used as the substrate included in the display device. A highly optically isotropic substrate has a low birefringence (in other words, a small amount of birefrin-gence).

The absolute value of a retardation (phase difference) of a highly optically isotropic substrate is preferably less than or equal to 30 nm, further preferably less than or equal to 20 nm, still further preferably less than or equal to 10 nm.

Examples of the film having high optical isotropy include a triacetyl cellulose (TAC, also referred to as cellulose triacetate) film, a cycloolefin polymer (COP) film, a cycloolefin copolymer (COC) film, and an acrylic film.

When a film is used for the substrate and the film absorbs water, the shape of the display panel might be changed, e.g., creases are generated. Thus, for the substrate, a film with a low water absorption rate is preferably used. For example, the water absorption rate of the film is preferably 1% or lower, further preferably 0.1% or lower, still further prefer-ably 0.01% or lower. As the resin layer 119, any of a variety of curable adhesives such as a reactive curable adhesive, a thermosetting curable adhesive, an anaerobic adhesive, and a photocurable adhesive such as an ultraviolet curable adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is pre-ferred. A two-component-mixture-type resin may be used. An adhesive sheet or the like may be used.

A space exists between the fourth electron-transport layer 116 and the electron-injection layer 114 in some cases. FIG. 1B illustrates an example in which a part to be the space is filled with an insulator 134. Note that the space is not formed and filling with the insulator 134 is not necessary in some cases, which depends on the distance between adjacent light-emitting devices, the thickness of the fourth electron-transport layer 116, the thickness of the electron-injection layer 114, and the like. In this case, a region between the adjacent light-emitting devices is filled with at least one of the fourth electron-transport layer 116 and the electron-injection layer 114.

The space includes, for example, any one or more selected from air, nitrogen, oxygen, carbon dioxide, and Group 18 elements (typically, helium, neon, argon, xenon, and kryp-ton). Furthermore, for example, a gas used during the deposition of the electron-injection layer 114 is sometimes included in the space. For example, in the case where the electron-injection layer 114 is deposited by a vacuum evapo-ration method, the space is in reduced-pressure atmosphere in some cases. In the case where a gas is included in the space, a gas can be identified with a gas chromatography method or the like.

In the case where the refractive index of the space is lower than that of the fourth electron-transport layer 116, light emitted from the first layer 113*a*, the second layer 113*b*, or the third layer 113*c* is reflected at the interface between the fourth electron-transport layer 116 and the space. Thus, light emitted from the first layer 113*a*, the second layer 113*b*, or the third layer 113*c* can be inhibited from entering an adjacent pixel (or subpixel). This can inhibit mixture of light of different colors, thereby improving the display quality of the display device.

One or both of an organic insulating material and an inorganic insulating material can be used as the material for the insulator 134 with which a part to be the space can be filled. At least one of a solid substance, a gelatinous sub-stance, and a liquid substance can be used for the insulator 134.

Examples of an organic insulating material include an acrylic resin, an epoxy resin, a polyimide resin, a polyamide resin, a polyimide-amide resin, a polysiloxane resin, a benzocyclobutene-based resin, and a phenol resin. A variety of resins that can be used for the insulating layer 119 may also be used.

Examples of an inorganic insulating material include an oxide insulating material, a nitride insulating material, an oxynitride insulating material, and a nitride oxide insulating material. An insulating material that can be used for the protective layers 131 and 132 may also be used.

As materials for a gate, a source, and a drain of a transistor and conductive layers such as a variety of wirings and electrodes included in the display device, any of metals such as aluminum, titanium, chromium, nickel, copper, yttrium, zirconium, molybdenum, silver, tantalum, and tungsten, or an alloy containing any of these metals as its main compo-nent can be used, for example. A single-layer structure or a stacked-layer structure including a film containing any of these materials can be used.

As a light-transmitting conductive material, a conductive oxide such as indium oxide, indium tin oxide, indium zinc oxide, zinc oxide, or zinc oxide containing gallium, or graphene can be used. It is also possible to use a metal material such as gold, silver, platinum, magnesium, nickel, tungsten, chromium, molybdenum, iron, cobalt, copper, palladium, or titanium; or an alloy material containing any of these metal materials. Alternatively, a nitride of the metal material (e.g., titanium nitride) or the like may be used. Note that in the case of using the metal material or the alloy material (or the nitride thereof), the thickness is preferably set small enough to transmit light. Alternatively, a stacked film of any of the above materials can be used for the conductive layers. For example, a stacked film of indium tin oxide and an alloy of silver and magnesium is preferably used because conductivity can be increased. They can also be used for conductive layers such as wirings and electrodes included in the display device, and conductive layers (e.g., a conductive layer functioning as a pixel electrode or a common electrode) included in a light-emitting device.

Examples of insulating materials that can be used for the insulating layers include a resin such as an acrylic resin or an epoxy resin, and an inorganic insulating material such as silicon oxide, silicon oxynitride, silicon nitride oxide, silicon nitride, or aluminum oxide.

[Manufacturing Method Example of Display Device]

Figures 2A, 2B, 2C:
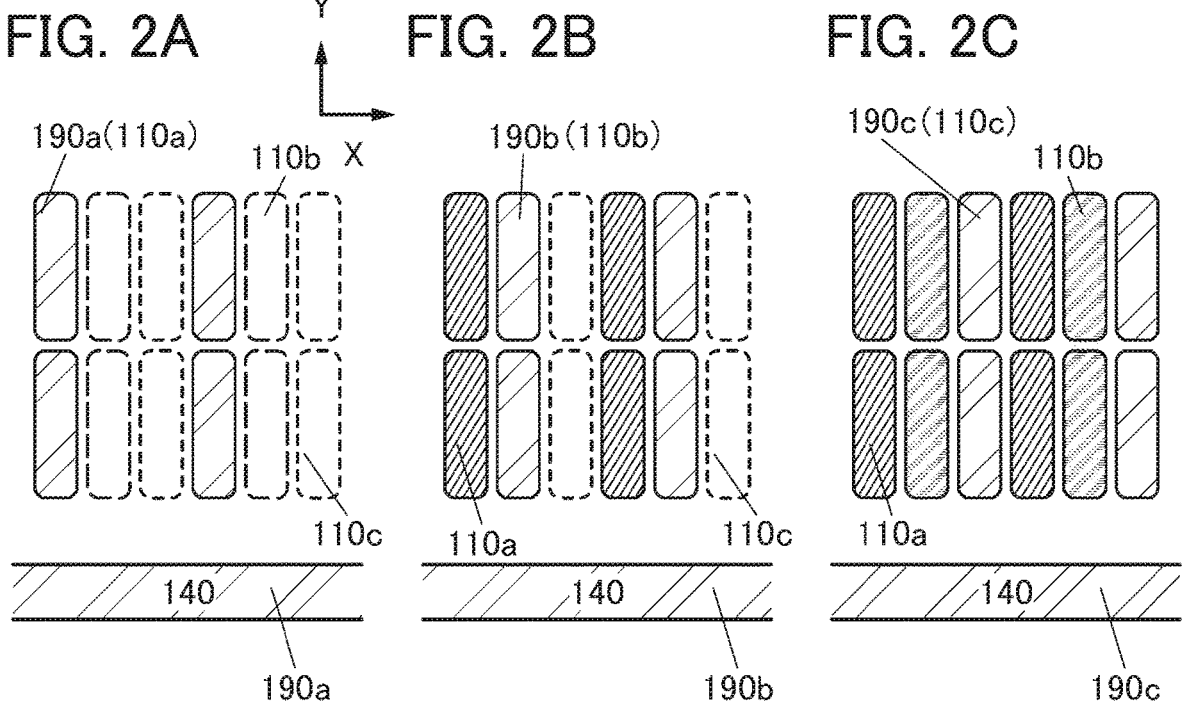
FIG. 2A to FIG. 2C are top views each illustrating an example of a display device.

Next, a manufacturing method example of a display device is described with reference to FIG. 2 to FIG. 7. FIG. 2A to FIG. 2C are top views illustrating the method for manufacturing a display device. FIG. 3A to FIG. 3C each illustrate a cross section along the dashed-dotted line X1-X2 and a cross section along the dashed-dotted line Y1-Y2 in FIG. 1A side by side. FIG. 4 to FIG. 7 are similar to FIG. 3.

Thin films that form the display device (insulating films, semiconductor films, conductive films, and the like) can be formed by a sputtering method, a chemical vapor deposition (CVD) method, a vacuum evaporation method, a pulsed laser deposition (PLD) method, an ALD method, or the like. Examples of the CVD method include a plasma-enhanced chemical vapor deposition (PECVD: Plasma Enhanced CVD) method and a thermal CVD method. As an example of the thermal CVD method, a metal organic chemical vapor deposition (MOCVD: Metal Organic CVD) method can be given.

The thin films that form the display device (insulating films, semiconductor films, conductive films, and the like) can be formed by a method such as spin coating, dipping, spray coating, ink-jetting, dispensing, screen printing, offset printing, a doctor knife, slit coating, roll coating, curtain coating, or knife coating.

For manufacture of the light-emitting devices, a vacuum process such as an evaporation method or a solution process such as a spin coating method or an ink-jet method can be especially used. As the evaporation method, a physical vapor deposition method (PVD method) such as a sputtering method, an ion plating method, an ion beam evaporation method, a molecular beam evaporation method, or a vacuum evaporation method, a chemical vapor deposition method (CVD method), and the like can be given. Specifically, the functional layers (e.g., the hole-injection layer, the hole-transport layer, the light-emitting layer, the electron-transport layer, and the electron-injection layer) included in the EL layers can be formed by an evaporation method (e.g., a vacuum evaporation method), a coating method (e.g., a dip coating method, a die coating method, a bar coating method, a spin coating method, or a spray coating method), a printing method (e.g., an ink-jet method, a screen printing (stencil) method, an offset printing (planography) method, a flexography (relief printing) method, a gravure printing method, or a micro-contact printing method), or the like.

When the thin films that form the display device are processed, a photolithography method or the like can be used. Alternatively, a nanoimprinting method, a sandblasting method, a lift-off method, or the like may be used for the processing of the thin films. Island-shaped thin films may be directly formed by a deposition method using a blocking mask such as a metal mask.

There are the following two typical examples of a photolithography method. In one of the methods, a resist mask is formed over a thin film that is to be processed, the thin film is processed by etching or the like, and the resist mask is removed. In the other method, after a photosensitive thin film is deposited, light exposure and development are performed, so that the thin film is processed into a desired shape.

As the light used for light exposure in the photolithography method, for example, an i-line (with a wavelength of 365 nm), a g-line (with a wavelength of 436 nm), an h-line (with a wavelength of 405 nm), or combined light of any of them can be used. Besides, ultraviolet light, KrF laser light, ArF laser light, or the like can be used. Light exposure may be performed by liquid immersion light exposure technique. As the light used for the light exposure, extreme ultraviolet (EUV) light or X-rays may be used. Furthermore, instead of the light used for the light exposure, an electron beam can also be used. It is preferable to use extreme ultraviolet light, X-rays, or an electron beam because extremely minute processing can be performed. Note that in the case of performing light exposure by scanning of a beam such as an electron beam, a photomask is not needed.

For etching of the thin film, a dry etching method, a wet etching method, a sandblasting method, or the like can be used.

First, as illustrated in FIG. 3A, a conductive film 111 is formed over the layer 101 including transistors.

Then, a first hole-injection layer 181A, a first hole-transport layer 182A, a first light-emitting layer 183A, and a first electron-transport layer 184A are formed in this order over the conductive film 111, and a first sacrificial layer 118A is formed over the first electron-transport layer 184A. As illustrated in FIG. 3A, end portions of the first hole-injection layer 181A, the first hole-transport layer 182A, the first light-emitting layer 183A, and the first electron-transport layer 184A that are closer to the connection portion 140 are positioned inside an end portion of the first sacrificial layer 118A in the cross-sectional view along the line Y1-Y2. For example, by using a mask for specifying a deposition area (also referred to as an area mask or a rough metal mask to be distinguished from a fine metal mask), the first hole-injection layer 181A, the first hole-transport layer 182A, the first light-emitting layer 183A, and the first electron-transport layer 184A can be deposited in regions different from the region where the first sacrificial layer 118A is deposited. The light-emitting device is formed using a resist mask in one embodiment of the present invention; when the resist mask is combined with an area mask as described above, the light-emitting device can be manufactured in a relatively simple process.

The conductive film 111 is a layer that is processed later to be the pixel electrodes 111a, 111b, and 111c and a conductive layer 123. Therefore, the conductive film 111 can employ the above-described structure that can be used for the pixel electrode. For formation of the conductive film 111, a sputtering method or a vacuum evaporation method can be used, for example.

The first hole-injection layer 181A, the first hole-transport layer 182A, the first light-emitting layer 183A, and the first electron-transport layer 184A are layers to be the first hole-injection layer 181a, the first hole-transport layer 182a, the first light-emitting layer 183a, and the first electron-transport layer 184a later, respectively. Therefore, the first hole-injection layer 181A, the first hole-transport layer 182A, the first light-emitting layer 183A, and the first electron-transport layer 184A can employ the above-described structures that can be used for the first hole-injection layer 181a, the first hole-transport layer 182a, the first light-emitting layer 183a, and the first electron-transport layer 184a, respectively. The first hole-injection layer 181A, the first hole-transport layer 182A, the first light-emitting layer 183A, and the first electron-transport layer 184A can each be formed by an evaporation method (including a vacuum evaporation method), a transfer method, a printing method, an ink-jet method, a coating method, or the like. The first and the first electron-transport layer 184A may each be formed using a premix material.

As the first sacrificial layer 118A, a film that is highly resistant to the process conditions for the first hole-injection layer 181A, the first hole-transport layer 182A, the first light-emitting layer 183A, and the first electron-transport layer 184A, and a second hole-injection layer 181B, a second hole-transport layer 182B, a second light-emitting layer 183B, a second electron-transport layer 184B, a third hole-injection layer 181C, a third hole-transport layer 182C, a third light-emitting layer 183C, a third electron-transport layer 184C, and the like formed in later steps, specifically, a film that has high etching selectivity with these layers, is used. The first sacrificial layer 118A may have a single-layer structure or a stacked-layer structure.

The first sacrificial layer 118A can be formed by a sputtering method, an ALD method (including a thermal ALD method and a PEALD method), or a vacuum evaporation method, for example. Note that a formation method that gives less damage to an EL layer is preferred, and an ALD method or a vacuum evaporation method is more suitable for the formation of the first sacrificial layer 118A than a sputtering method.

As the first sacrificial layer 118A, a film that can be removed by a wet etching method is preferably used. The use of a wet etching method can reduce damage to the first hole-injection layer 181A, the first hole-transport layer 182A, the first light-emitting layer 183A, and the first electron-transport layer 184A in processing of the first sacrificial layer 118A, as compared with the case of using a dry etching method.

In the method for manufacturing a display device of this embodiment, it is desirable that the layers (e.g., the hole-injection layer, the hole-transport layer, the light-emitting layer, and the electron-transport layer) included in the EL layer not be easily processed in the step of processing the sacrificial layers, and that the sacrificial layers not be easily processed in the steps of processing the layers included in the EL layer. These are preferably taken into consideration to select the materials and a processing method for the sacrificial layers and processing methods for the EL layer.

The first sacrificial layer 118A can be formed using an inorganic film such as a metal film, an alloy film, a metal oxide film, a semiconductor film, or an inorganic insulating film, for example.

For the first sacrificial layer 118A, a metal material such as gold, silver, platinum, magnesium, nickel, tungsten, chromium, molybdenum, iron, cobalt, copper, palladium, titanium, aluminum, yttrium, zirconium, or tantalum or an alloy material containing the metal material can be used.

For the first sacrificial layer 118A, a metal oxide such as In—Ga—Zn oxide can be used. As the first sacrificial layer 118A, an In—Ga—Zn oxide film can be formed by a sputtering method, for example. It is also possible to use indium oxide, In—Zn oxide, In—Sn oxide, indium titanium oxide (In—Ti oxide), indium tin zinc oxide (In—Sn—Zn oxide), indium titanium zinc oxide (In—Ti—Zn oxide), indium gallium tin zinc oxide (In—Ga—Sn—Zn oxide), or the like. Alternatively, indium tin oxide containing silicon, or the like can also be used.

Note that an element M (M is one or more of aluminum, silicon, boron, yttrium, copper, vanadium, beryllium, titanium, iron, nickel, germanium, zirconium, molybdenum, lanthanum, cerium, neodymium, hafnium, tantalum, tungsten, and magnesium) may be used instead of gallium.

As the first sacrificial layer 118A, a variety of inorganic insulating films that can be used as the protective layers 131 and 132 can be used. In particular, an oxide insulating film is preferable because having higher adhesion to the EL layer than a nitride insulating film. For example, an inorganic insulating material such as aluminum oxide, hafnium oxide, or silicon oxide can be used for the first sacrificial layer 118A. As the first sacrificial layer 118A, for example, an aluminum oxide film can be formed by an ALD method. The ALD method is preferably used because damage to a base layer (particularly the EL layer or the like) can be reduced.

Next, a resist mask 190*a* is formed over the first sacrificial layer 118A as illustrated in FIG. 3B. The resist mask can be formed by application of a photosensitive resin (photoresist), light exposure, and development.

As illustrated in FIG. 2A, the resist mask 190*a* is provided at a position overlapping with a region to be the subpixel 110*a* later. The resist mask 190*a* is preferably provided also at a position overlapping with a region to be the connection portion 140 later. This can inhibit a region of the conductive film 111, which is to be the conductive layer 123 later, from being damaged during the manufacturing process of the display device. One island-shaped pattern is preferably provided for one subpixel 110*a* as the resist mask 190*a*. Alternatively, one band-like pattern for a plurality of subpixels 110*a* aligned in one column (aligned in the Y direction in FIG. 2A) may be formed as the resist mask 190*a*.

Then, as illustrated in FIG. 3C, part of the first hole-injection layer 181A, part of the first hole-transport layer 182A, part of the first light-emitting layer 183A, part of the first electron-transport layer 184A, and part of the first sacrificial layer 118A are removed using the resist mask 190*a*. As a result, regions of the first hole-injection layer 181A, the first hole-transport layer 182A, the first light-emitting layer 183A, the first electron-transport layer 184A, and the first sacrificial layer 118A, which do not overlap with the resist mask 190*a*, can be removed. Thus, part of the conductive film 111 is exposed. In a region corresponding to the subpixel 110*a*, a stacked-layer structure of the first hole-injection layer 181*a*, the first hole-transport layer 182*a*, the first light-emitting layer 183*a*, the first electron-transport layer 184*a*, a first sacrificial layer 118*a*, and the resist mask 190*a* remains over the conductive film 111. In a region corresponding to the connection portion 140, a stacked-layer structure of the first sacrificial layer 118*a* and the resist mask 190*a* remains over the conductive film 111. Note that the stacked-layer structure of the first hole-injection layer 181*a*, the first hole-transport layer 182*a*, the first light-emitting layer 183*a*, and the first electron-transport layer 184*a* is also referred to as the first layer 113*a*. After that, the resist mask 190*a* is removed.

The first sacrificial layer 118A can be processed by a wet etching method or a dry etching method. The first sacrificial layer 118A is preferably processed by anisotropic etching.

The use of a wet etching method can reduce damage to the first hole-injection layer 181A, the first hole-transport layer 182A, the first light-emitting layer 183A, and the first electron-transport layer 184A in processing of the first sacrificial layer 118A, as compared with the case of using a dry etching method. In the case of using a wet etching method, it is preferable to use a developer, an aqueous solution of tetramethylammonium hydroxide (TMAH), dilute hydrofluoric acid, oxalic acid, phosphoric acid, acetic acid, nitric acid, a chemical solution containing a mixed solution thereof, or the like, for example.

In the case of using a dry etching method, deterioration of the first hole-injection layer 181A, the first hole-transport layer 182A, the first light-emitting layer 183A, and the first electron-transport layer 184A can be inhibited by not using a gas containing oxygen as the etching gas. In the case of using a dry etching method, it is preferable to use a gas containing $CF_4$, $C_4F_8$, $SF_6$, $CHF_3$, $Cl_2$, $H_2O$, $BCl_3$, or a noble gas (also referred to as rare gas) such as He as the etching gas, for example.

Note that FIG. 3C illustrates, but the present invention is not limited to, an example in which the first hole-injection layer 181A, the first hole-transport layer 182A, the first light-emitting layer 183A, the first electron-transport layer 184A, and the first sacrificial layer 118A are processed in a state where the resist mask 190a is left. For example, in the case where the first sacrificial layer 118A has a stacked-layer structure, some of the first sacrificial layer 118A may be processed using the resist mask 190a, and the other layers may be processed with the processed layers used as a hard mask after the resist mask 190a is removed.

For example, some of the first sacrificial layer 118A are processed using the resist mask 190a; then, the resist mask 190a is removed by ashing or the like using oxygen plasma. At this time, the other layers of the first sacrificial layer 118A are positioned on the outermost surface and the first hole-injection layer 181A, the first hole-transport layer 182A, the first light-emitting layer 183A, and the first electron-transport layer 184A are not exposed; thus, the first hole-injection layer 181A, the first hole-transport layer 182A, the first light-emitting layer 183A, and the first electron-transport layer 184A can be inhibited from being damaged in the step of removing the resist mask 190a. Then, with the processed layers of the first sacrificial layer 118A used as a hard mask, the other layers of the first sacrificial layer 118A and the first hole-injection layer 181A, the first hole-transport layer 182A, the first light-emitting layer 183A, and the first electron-transport layer 184A can be processed.

The first hole-injection layer 181A, the first hole-transport layer 182A, the first light-emitting layer 183A, and the first electron-transport layer 184A are preferably processed by anisotropic etching. Anisotropic dry etching is particularly preferable. As an etching gas, a gas containing nitrogen, a gas containing hydrogen, a gas containing a noble gas, a gas containing nitrogen and argon, a gas containing nitrogen and hydrogen, or the like is preferably used. Deterioration of the first hole-injection layer 181A, the first hole-transport layer 182A, the first light-emitting layer 183A, and the first electron-transport layer 184A can be inhibited by not using a gas containing oxygen as the etching gas.

A gas containing oxygen may be used as the etching gas. When the etching gas contains oxygen, the etching rate can be increased. Therefore, the etching can be performed under a low-power condition while an adequately high etching rate is maintained. Thus, damage to the first and the first electron-transport layer 184A can be inhibited. Furthermore, a defect such as attachment of a reaction product generated at the etching can be inhibited.

Figures 4A, 4B, 4C:
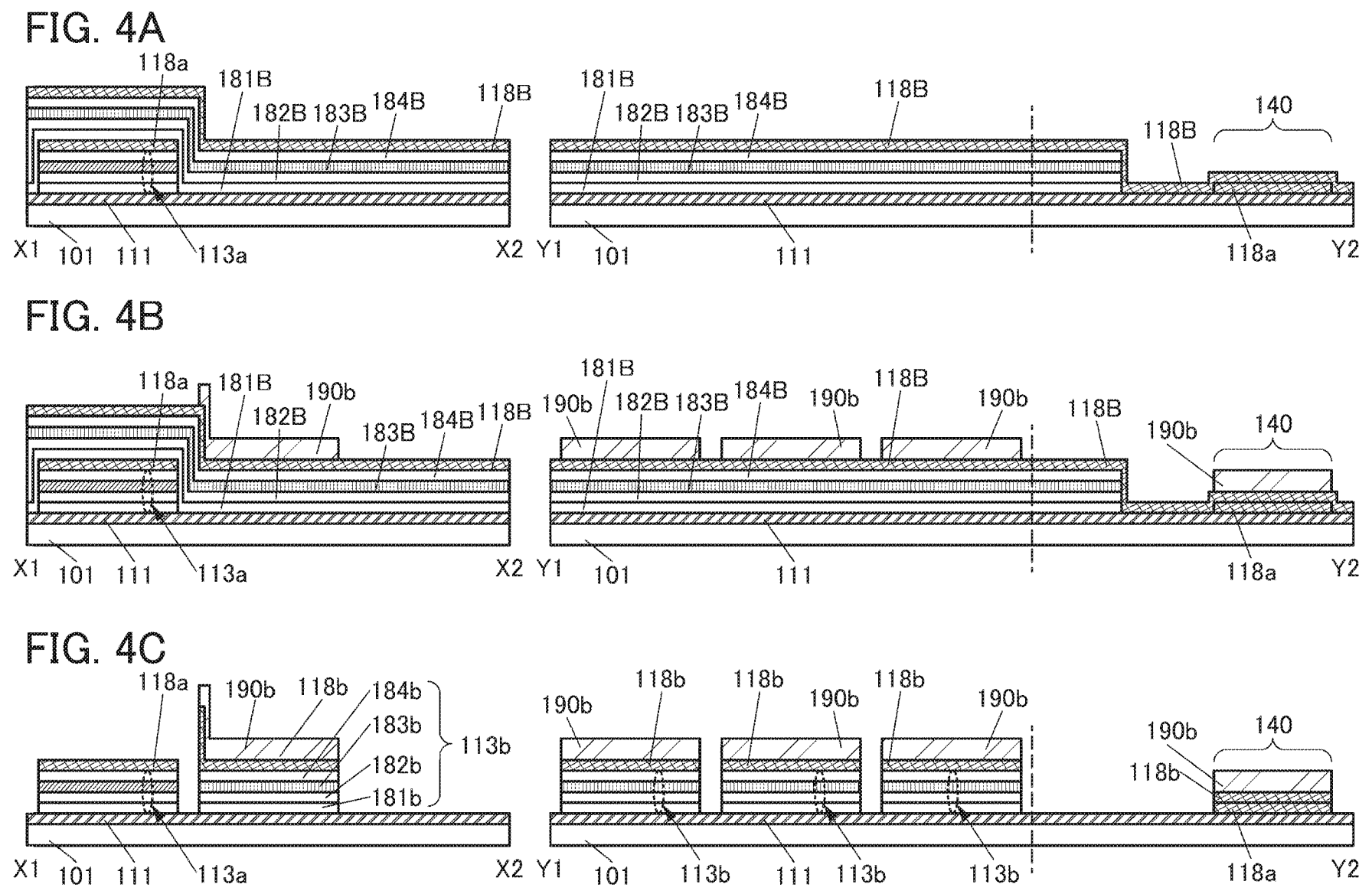

Next, as illustrated in FIG. 4A, the second hole-injection layer 181B, the second hole-transport layer 182B, the second light-emitting layer 183B, and the second electron-transport layer 184B are formed in this order over the first sacrificial layer 118a and the conductive film 111, and a second sacrificial layer 118B is formed over the second electron-transport layer 184B. As illustrated in FIG. 4A, end portions of the second hole-injection layer 181B, the second hole-transport layer 182B, the second light-emitting layer 183B, and the second electron-transport layer 184B that are closer to the connection portion 140 are positioned inside an end portion of the second sacrificial layer 118B in the cross-sectional view along the line Y1-Y2.

The second hole-injection layer 181B, the second hole-transport layer 182B, the second light-emitting layer 183B, and the second electron-transport layer 184B are layers to be the second hole-injection layer 181b, the second hole-transport layer 182b, the second light-emitting layer 183b, and the second electron-transport layer 184b later, respectively. The second light-emitting layer 183b emits light of a color different from that of light emitted by the first light-emitting layer 183a. Structures, materials, and the like that can be used for the second hole-injection layer 181b, the second hole-transport layer 182b, the second light-emitting layer 183b, and the second electron-transport layer 184b are similar to those for the first hole-injection layer 181a, the first hole-transport layer 182a, the first light-emitting layer 183a, and the first electron-transport layer 184a, respectively. The second hole-transport layer 182B, the second light-emitting layer 183B, and the second electron-transport layer 184B can be deposited by a method similar to that for the first hole-injection layer 181A, the first hole-transport layer 182A, the first light-emitting layer 183A, and the first electron-transport layer 184A.

The second sacrificial layer 118B can be formed using a material that can be used for the first sacrificial layer 118A.

Next, a resist mask 190b is formed over the second sacrificial layer 118B as illustrated in FIG. 4B.

As illustrated in FIG. 2B, the resist mask 190b is provided at a position overlapping with a region to be the subpixel 110b later. The resist mask 190b is preferably provided also at a position overlapping with a region to be the connection portion 140 later. This can inhibit a region of the conductive film 111, which is to be the conductive layer 123 later, from being damaged during the manufacturing process of the display device. Note that when the first sacrificial layer 118a is provided in the region to be the connection portion 140 later, the resist mask 190b is not necessarily provided in the region. One island-shaped pattern is preferably provided for one subpixel 110b as the resist mask 190b. Alternatively, one band-like pattern for a plurality of subpixels 110b aligned in one column may be formed as the resist mask 190b.

Then, as illustrated in FIG. 4C, part of the second hole-injection layer 181B, part of the second hole-transport layer 182B, part of the second light-emitting layer 183B, part of the second electron-transport layer 184B, and part of the second sacrificial layer 118B are removed using the resist mask 190b. As a result, regions of the second hole-injection layer 181B, the second hole-transport layer 182B, the second light-emitting layer 183B, the second electron-transport layer 184B, and the second sacrificial layer 118B, which do not overlap with the resist mask 190b, can be removed. Thus, part of the conductive film 111 is exposed. In a region corresponding to the subpixel 110b, a stacked-layer structure of the second hole-injection layer 181b, the second hole-transport layer 182b, the second light-emitting layer 183b, the second electron-transport layer 184b, a second sacrificial layer 118b, and the resist mask 190b remains over the conductive film 111. In a region corresponding to the connection portion 140, a stacked-layer structure of the first sacrificial layer 118a, the second sacrificial layer 118b, and the resist mask 190b remains over the conductive film 111. Note that the stacked-layer structure of the second hole-injection layer 181b, the second hole-transport layer 182b, the second light-emitting layer 183b, and the second electron-transport layer 184b is also referred to as the second layer 113b. After that, the resist mask 190b is removed.

The second sacrificial layer 118B can be processed by a method that can be used for processing of the first sacrificial layer 118A. The second hole-injection layer 181B, the second hole-transport layer 182B, the second light-emitting layer 183B, and the second electron-transport layer 184B can be processed by a method that can be used for processing of the first hole-injection layer 181A, the first hole-transport layer 182A, the first light-emitting layer 183A, and the first electron-transport layer 184A. The resist mask 190b can be removed by a method and at a timing that can be used for removing of the resist mask 190a.

Figures 5A, 5B, 5C:
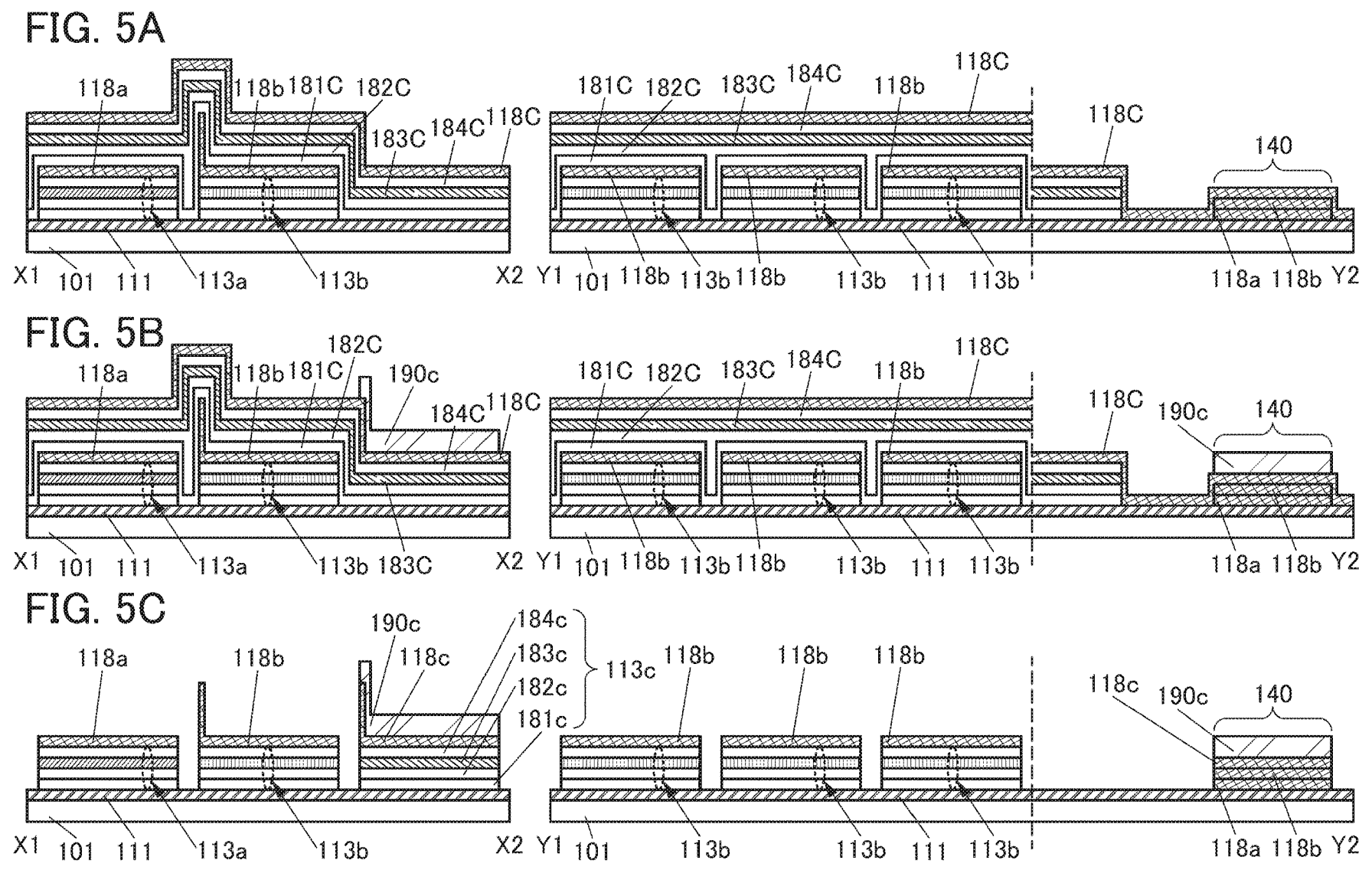

Next, as illustrated in FIG. 5A, the third hole-injection layer 181C, the third hole-transport layer 182C, the third light-emitting layer 183C, and the third electron-transport layer 184C are formed in this order over the first sacrificial layer 118a, the second sacrificial layer 118b, and the conductive film 111, and a third sacrificial layer 118C is formed over the third electron-transport layer 184C. As illustrated in FIG. 5A, end portions of the third hole-injection layer 181C, the third hole-transport layer 182C, the third light-emitting layer 183C, and the third electron-transport layer 184C that are closer to the connection portion 140 are positioned inside an end portion of the third sacrificial layer 118C in the cross-sectional view along the line Y1-Y2.

The third hole-injection layer 181C, the third hole-transport layer 182C, the third light-emitting layer 183C, and the third electron-transport layer 184C are layers to be the third hole-injection layer 181c, the third hole-transport layer 182c, the third light-emitting layer 183c, and the third electron-transport layer 184c later, respectively. The third light-emitting layer 183c emits light of a color different from that of light emitted by the first light-emitting layer 183a and the second light-emitting layer 183b. Structures, materials, and the like that can be used for the third hole-injection layer 181c, the third hole-transport layer 182c, the third light-emitting layer 183c, and the third electron-transport layer 184c are similar to those for the first hole-injection layer 181a, the first hole-transport layer 182a, the first light-emitting layer 183a, and the first electron-transport layer 184a, respectively. The third hole-injection layer 181C, the third hole-transport layer 182C, the third light-emitting layer 183C, and the third electron-transport layer 184C can be deposited by a method similar to that for the first hole-injection layer 181A, the first hole-transport layer 182A, the first light-emitting layer 183A, and the first electron-transport layer 184A.

The third sacrificial layer 118C can be formed using a material that can be used for the first sacrificial layer 118A.

Next, a resist mask 190c is formed over the third sacrificial layer 118C as illustrated in FIG. 5B.

As illustrated in FIG. 2C, the resist mask 190c is provided at a position overlapping with a region to be the subpixel 110c later. One island-shaped pattern is preferably provided for one subpixel 110c as the resist mask 190c. Alternatively, one band-like pattern for a plurality of subpixels 110c aligned in one column may be formed as the resist mask 190c. The resist mask 190c is preferably provided also at a position overlapping with a region to be the connection portion 140 later. Note that when at least one of the first sacrificial layer 118a and the second sacrificial layer 118b is provided in the region to be the connection portion 140 later, the resist mask 190c is not necessarily provided in the region.

Then, as illustrated in FIG. 5C, part of the third hole-injection layer 181C, part of the third hole-transport layer 182C, part of the third light-emitting layer 183C, part of the third electron-transport layer 184C, and part of the third sacrificial layer 118C are removed using the resist mask 190c. As a result, regions of the third hole-injection layer 181C, the third hole-transport layer 182C, the third light-emitting layer 183C, the third electron-transport layer 184C, and the third sacrificial layer 118C, which do not overlap with the resist mask 190c, can be removed. In a region corresponding to the subpixel 110c, a stacked-layer structure of the third hole-injection layer 181c, the third hole-transport layer 182c, the third light-emitting layer 183c, the third electron-transport layer 184c, a third sacrificial layer 118c, and the resist mask 190c remains over the conductive film 111. In a region corresponding to the connection portion 140, a stacked-layer structure of the first sacrificial layer 118a, the second sacrificial layer 118b, the third sacrificial layer 118c, and the resist mask 190c remains over the conductive film 111. Note that the stacked-layer structure of the third hole-injection layer 181c, the third hole-transport layer 182c, the third light-emitting layer 183c, and the third electron-transport layer 184c is also referred to as the third layer 113c. After that, the resist mask 190c is removed as illustrated in FIG. 6A.

The third sacrificial layer 118C can be processed by a method that can be used for processing of the first sacrificial layer 118A. The third hole-injection layer 181C, the third hole-transport layer 182C, the third light-emitting layer 183C, and the third electron-transport layer 184C can be processed by a method that can be used for processing of the first hole-injection layer 181A, the first hole-transport layer 182A, the first light-emitting layer 183A, and the first electron-transport layer 184A. The resist mask 190c can be removed by a method and at a timing that can be used for removing of the resist mask 190a.

Then, as illustrated in FIG. 6B, the conductive film 111 is processed with the first sacrificial layer 118a, the second sacrificial layer 118b, and the third sacrificial layer 118c used as a hard mask, so that the pixel electrodes 111a, 111b, and 111c and the conductive layer 123 are formed.

In processing of the conductive film 111, part of the layer 101 including transistors (specifically, an insulating layer positioned on the outermost surface) is processed to form a recessed portion in some cases. Hereinafter, the case where a recessed portion is provided in the layer 101 including transistors is described as an example; however, the recessed portion is not necessarily provided.

To form the conductive layer 123 here, at least the third sacrificial layer 118c only needs to be provided in the connection portion 140. Meanwhile, as described above, the stacked-layer structure of the second sacrificial layer 118b and the third sacrificial layer 118c or the stacked-layer structure of the first sacrificial layer 118a, the second sacrificial layer 118b, and the third sacrificial layer 118c is preferably provided in the connection portion 140, in which case a region of the conductive film 111, which is to be the conductive layer 123, can be inhibited from being damaged during the manufacturing process of the display device.

The conductive film 111 can be processed by a wet etching method or a dry etching method. The conductive film 111 is preferably processed by anisotropic etching.

Next, as illustrated in FIG. 6C, the first sacrificial layer 118a, the second sacrificial layer 118b, and the third sacrificial layer 118c are removed. As a result, the first electron-transport layer 184a is exposed on the pixel electrode 111a, the second electron-transport layer 184b is exposed on the pixel electrode 111b, the third electron-transport layer 184c is exposed on the pixel electrode 111c, and the conductive layer 123 is exposed on the connection portion 140.

The step of removing the sacrificial layers can be performed by a method similar to that for the step of processing the sacrificial layers. In particular, the use of a wet etching method can reduce damage to the first layer 113a, the second layer 113b, and the third layer 113c at the time of removing the first sacrificial layer 118a, the second sacrificial layer 118b, and the third sacrificial layer 118c, as compared to the case of using a dry etching method.

Then, as illustrated in FIG. 7A, the fourth electron-transport layer 116 is formed to cover the first layer 113a, the second layer 113b, and the third layer 113c. As illustrated in FIG. 7A, the end portion of the fourth electron-transport layer 116 that is closer to the connection portion 140 is positioned inside the connection portion 140 in the cross-sectional view along the line Y1-Y2, and the conductive layer 123 is exposed.

Materials that can be used for the fourth electron-transport layer 116 are as described above. The fourth electron-transport layer 116 can be formed by an evaporation method (including a vacuum evaporation method), a transfer method, a printing method, an inkjet method, a coating method, or the like. The fourth electron-transport layer 116 may be formed using a premix material.

The fourth electron-transport layer 116 is formed using a material that has a higher insulating property than the material for the electron-injection layer 114 formed later. The fourth electron-transport layer 116, which is provided to cover top and side surfaces of the first layer 113a, the second layer 113b, and the third layer 113c and side surfaces of the pixel electrodes 111a, 111b, and 111c, can inhibit these layers from being in contact with the highly conductive electron-injection layer 114 and can inhibit a short circuit in the light-emitting device. Accordingly, the reliability of the light-emitting device can be increased.

In particular, the recessed portion is preferably provided in part of the layer 101 including transistors (specifically, an insulating layer positioned on the outermost surface), in which case the side surfaces of the pixel electrodes 111a, 111b, and 111c can be entirely covered with the fourth electron-transport layer 116.

Then, as illustrated in FIG. 7B, the electron-injection layer 114 is formed over the fourth electron-transport layer 116. As illustrated in FIG. 7B, the end portion of the electron-injection layer 114 that is closer to the connection portion 140 is positioned inside the connection portion 140 in the cross-sectional view along the line Y1-Y2, and the conductive layer 123 is exposed.

Materials that can be used for the electron-injection layer 114 are as described above. The electron-injection layer 114 can be formed by an evaporation method (including a vacuum evaporation method), a transfer method, a printing method, an inkjet method, a coating method, or the like. The electron-injection layer 114 may be formed using a premix material.

Although a space 133 is formed by deposition of the electron-injection layer 114 in the example shown here, the space 133 is not necessarily formed. In the latter case, a region between two light-emitting devices is filled with the electron-injection layer 114. Alternatively, the region between two light-emitting devices may be filled with the fourth electron-transport layer 116 before the deposition of the electron-injection layer 114.

Alternatively, as illustrated in FIG. 7C, a part to be the space 133 may be filled with the insulator 134 in advance. The details of the space 133 and the insulator 134 are as described above.

Then, the common electrode 115 is formed over the electron-injection layer 114.

Materials that can be used for the common electrode 115 are as described above. The common electrode 115 can be formed by a sputtering method or a vacuum evaporation method, for example.

After that, the protective layer 131 is formed over the common electrode 115, and the protective layer 132 is formed over the protective layer 131. Furthermore, the substrate 120 is attached to the protective layer 132 with the resin layer 119, whereby the display device 100 illustrated in FIG. 1B can be manufactured.

Materials and deposition methods that can be used for the protective layers 131 and 132 are as described above. Examples of the deposition method of the protective layers 131 and 132 include a vacuum evaporation method, a sputtering method, a CVD method, and an ALD method. The protective layer 131 and the protective layer 132 may be films formed by different deposition methods. The protective layers 131 and 132 may each have a single-layer structure or a stacked-layer structure.

As described above, in the method for manufacturing a display device of one embodiment of the present invention, the island-shaped EL layers are formed not by using a fine metal mask but by processing an EL layer deposited over the entire surface; thus, the island-shaped EL layers can be formed to have a uniform thickness.

The first layer, the second layer, and the third layer included in the light-emitting devices of different colors are formed in separate steps. Accordingly, EL layers can be formed to have structures (a material, a thickness, and the like) appropriate for the light-emitting devices of the respective colors. Thus, the light-emitting devices can have favorable characteristics.

The display device of one embodiment of the present invention includes an island-shaped first electron-transport layer over a light-emitting layer, and further includes a second electron-transport layer that covers side surfaces of a pixel electrode, the light-emitting layer, and the first electron-transport layer. In the manufacturing process of the display device, the EL layer is processed while the light-emitting layer and the first electron-transport layer are stacked; hence, damage to the light-emitting layer is reduced in the display device. In addition, the second electron-transport layer inhibits the pixel electrode from being in contact with an electron-injection layer or a common electrode, thereby inhibiting a short circuit in the light-emitting device.

This embodiment can be combined with the other embodiments as appropriate. In the case where a plurality of structure examples are described in one embodiment in this specification, the structure examples can be combined as appropriate.

Embodiment 2

In this embodiment, a display device of one embodiment of the present invention is described with reference to FIG. 8 to FIG. 11.

The display device in this embodiment can be a high-resolution display device. Accordingly, the display device in this embodiment can be used for display portions of information terminals (wearable devices) such as watch-type and bracelet-type information terminals and display portions of wearable devices capable of being worn on the head, such as a VR device like a head-mounted display and a glasses-type AR device.

[Display Module]

Figure 8A:
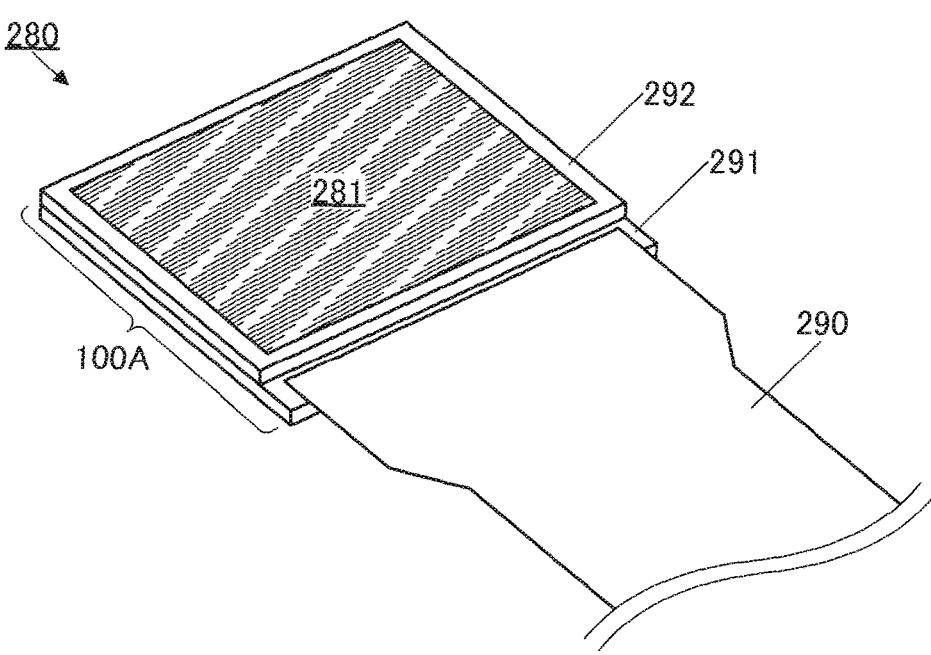
FIG. 8A and FIG. 8B are perspective views illustrating an example of a display module.

FIG. 8A is a perspective view of a display module 280. The display module 280 includes a display device 100A and an FPC 290. Note that the display device included in the display module 280 is not limited to the display device 100A and may be any of a display device 100B or a display device 100C described later.

The display module 280 includes a substrate 291 and a substrate 292. The display module 280 includes a display portion 281. The display portion 281 is a region of the display module 280 where an image is displayed, and is a region where light emitted from pixels provided in a pixel portion 284 described later can be seen.

Figure 8B:
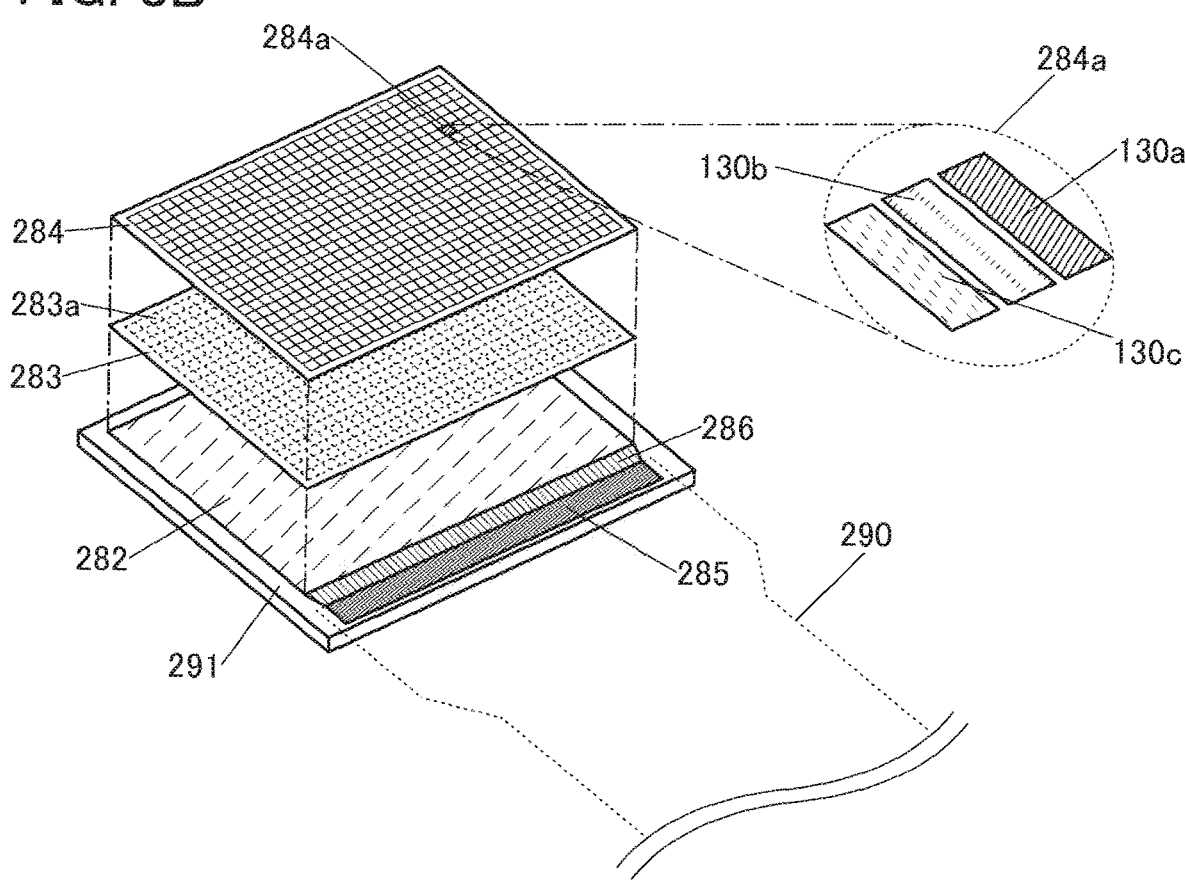

FIG. 8B is a perspective view schematically illustrating a structure on the substrate 291 side. Over the substrate 291, a circuit portion 282, a pixel circuit portion 283 over the circuit portion 282, and the pixel portion 284 over the pixel circuit portion 283 are stacked. A terminal portion 285 to be connected to the FPC 290 is provided in a portion over the substrate 291 that does not overlap with the pixel portion 284. The terminal portion 285 and the circuit portion 282 are electrically connected to each other through a wiring portion 286 formed of a plurality of wirings.

The pixel portion 284 includes a plurality of pixels 284a arranged periodically. An enlarged view of one pixel 284a is illustrated on the right side in FIG. 8B. The pixel 284a includes the light-emitting devices 130a, 130b, and 130c that emit light of different colors from each other. In this embodiment, the case where the pixel 284a includes the light-emitting device 130a emitting red light, the light-emitting device 130b emitting green light, and the light-emitting device 130c emitting blue light is described as an example. The plurality of light-emitting devices can be arranged in a stripe pattern as illustrated in FIG. 8B. Alternatively, a variety of arrangement methods of light-emitting devices, such as a delta pattern or a PenTile pattern can be employed.

In the case where a pixel of the display device includes three kinds of subpixels including light-emitting devices emitting light of different colors from each other, the three subpixels can be of three colors of R, G, and B or of three colors of yellow (Y), cyan (C), and magenta (M). In the case where four subpixels are included, the four subpixels can be subpixels of four colors of R, G, B, and white (W), subpixels of four colors of R, G, B, and Y, or the like.

The pixel circuit portion 283 includes a plurality of pixel circuits 283a arranged periodically.

One pixel circuit 283a is a circuit that controls light emission of three light-emitting devices included in one pixel 284a. One pixel circuit 283a may be provided with three circuits each of which controls light emission of one light-emitting device. For example, the pixel circuit 283a can include at least one selection transistor, one current control transistor (driving transistor), and a capacitor for one light-emitting device. A gate signal is input to a gate of the selection transistor, and a source signal is input to one of a source and a drain of the selection transistor. With such a structure, an active-matrix display device is achieved.

There is no particular limitation on the structure of the transistors included in the display device of this embodiment. For example, a planar transistor, a staggered transistor, or an inverted staggered transistor can be used. A top-gate transistor or a bottom-gate transistor can be used. Alternatively, gates may be provided above and below a semiconductor layer where a channel is formed.

There is no particular limitation on the crystallinity of a semiconductor material used for the transistors, and any of an amorphous semiconductor, a single crystal semiconductor, and a semiconductor having crystallinity other than single crystal (a microcrystalline semiconductor, a polycrystalline semiconductor, or a semiconductor partly including crystal regions) may be used. It is preferable to use a single crystal semiconductor or a semiconductor having crystallinity because degradation of transistor characteristics can be inhibited.

It is preferable that a semiconductor layer of a transistor contain a metal oxide (also referred to as an oxide semiconductor). That is, a transistor including a metal oxide in its channel formation region (hereinafter, also referred to as an OS transistor) is preferably used for the display device of this embodiment. Alternatively, the transistor preferably includes silicon in a semiconductor layer. Examples of silicon include amorphous silicon and crystalline silicon (e.g., low-temperature polysilicon or single crystal silicon).

The semiconductor layer preferably contains indium, M (M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. Specifically, M is preferably one or more kinds selected from aluminum, gallium, yttrium, and tin.

It is particularly preferable that an oxide containing indium (In), gallium (Ga), and zinc (Zn) (also referred to as IGZO) be used for the semiconductor layer.

When the semiconductor layer is an In—M—Zn oxide, the atomic ratio of In is preferably greater than or equal to the atomic ratio of M in the In—M—Zn oxide. Examples of the atomic ratio of the metal elements in such an In—M—Zn oxide are In:M:Zn=1:1:1 or a composition in the neighborhood thereof, In:M:Zn=1:1:1.2 or a composition in the neighborhood thereof, In:M:Zn=2:1:3 or a composition in the neighborhood thereof, In:M:Zn=3:1:2 or a composition in the neighborhood thereof, In:M:Zn=4:2:3 or a composition in the neighborhood thereof, In:M:Zn=4:2:4.1 or a composition in the neighborhood thereof, In:M:Zn=5:1:3 or a composition in the neighborhood thereof, In:M:Zn=5:1:6 or a composition in the neighborhood thereof, In:M:Zn=5:1:7 or a composition in the neighborhood thereof, In:M:Zn=5:1:8 or a composition in the neighborhood thereof, In:M:Zn=6:1:6 or a composition in the neighborhood thereof, and In:M:Zn=5:2:5 or a composition in the neighborhood thereof. Note that a composition in the neighborhood includes the range of ±30% of an intended atomic ratio.

For example, when the atomic ratio is described as In:Ga:Zn=4:2:3 or a composition in the neighborhood thereof, the case is included where Ga is greater than or equal to 1 and less than or equal to 3 and Zn is greater than or equal to 2 and less than or equal to 4 with In being 4. When the atomic ratio is described as In:Ga:Zn=5:1:6 or a composition in the neighborhood thereof, the case is included where Ga is greater than 0.1 and less than or equal to 2 and Zn is greater than or equal to 5 and less than or equal to 7 with In being 5. When the atomic ratio is described as In:Ga:Zn=1:1:1 or a composition in the neighborhood thereof, the case is included where Ga is greater than 0.1 and less than or equal to 2 and Zn is greater than 0.1 and less than or equal to 2 with In being 1.

The transistors included in the circuit portion 282 and the transistors included in the pixel circuit portion 283 may have the same structure or different structures. One structure or two or more kinds of structures may be employed for a plurality of transistors included in the circuit portion 282.

Similarly, one structure or two or more kinds of structures may be employed for a plurality of transistors included in the pixel circuit portion 283.

The circuit portion 282 includes a circuit for driving the pixel circuits 283a in the pixel circuit portion 283. For example, the circuit portion 282 preferably includes one or both of a gate line driver circuit and a source line driver circuit. The circuit portion 282 may also include at least one of an arithmetic circuit, a memory circuit, a power supply circuit, and the like.

The FPC 290 functions as a wiring for supplying a video signal, a power supply potential, or the like to the circuit portion 282 from the outside. An IC (integrated circuit) may be mounted on the FPC 290.

The display module 280 can have a structure in which one or both of the pixel circuit portion 283 and the circuit portion 282 are stacked below the pixel portion 284; hence, the aperture ratio (effective display area ratio) of the display portion 281 can be significantly high. For example, the aperture ratio of the display portion 281 can be greater than or equal to 40% and less than 100%, preferably greater than or equal to 50% and less than or equal to 95%, further preferably greater than or equal to 60% and less than or equal to 95%. Furthermore, the pixels 284a can be arranged extremely densely and thus the display portion 281 can have extremely high resolution. For example, the pixels 284a are preferably arranged in the display portion 281 with a resolution greater than or equal to 2000 ppi, preferably greater than or equal to 3000 ppi, further preferably greater than or equal to 5000 ppi, still further preferably greater than or equal to 6000 ppi, and less than or equal to 20000 ppi or less than or equal to 30000 ppi.

Such a display module 280 has extremely high resolution, and thus can be suitably used for a VR device such as a head-mounted display or a glasses-type AR device. For example, even with a structure in which the display portion of the display module 280 is seen through a lens, pixels of the extremely-high-resolution display portion 281 included in the display module 280 are prevented from being perceived when the display portion is enlarged by the lens, so that display providing a high sense of immersion can be performed. Without being limited thereto, the display module 280 can be suitably used for electronic devices including a relatively small display portion. For example, the display module 280 can be favorably used in a display portion of a wearable electronic device, such as a wrist watch.

[Display Device 100A]

Figure 9:
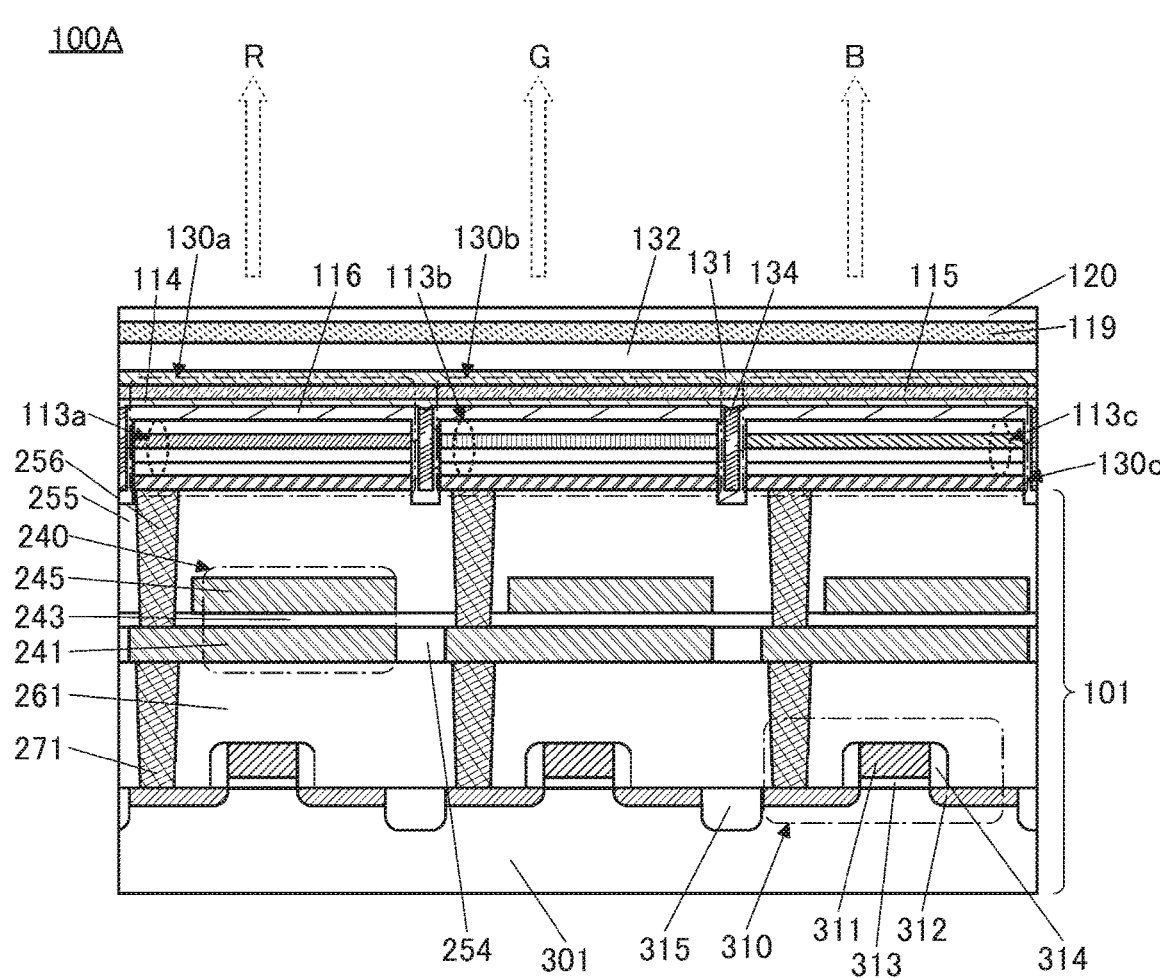
FIG. 9 is a cross-sectional view illustrating an example of a display device.

The display device 100A illustrated in FIG. 9 includes a substrate 301, the light-emitting devices 130a, 130b, and 130c, a capacitor 240, and a transistor 310.

The substrate 301 corresponds to the substrate 291 illustrated in FIG. 8A and FIG. 8B. A stacked-layer structure including the substrate 301 and the components thereover up to an insulating layer 255 corresponds to the layer 101 including transistors in Embodiment 1.

The transistor 310 is a transistor whose channel formation region is in the substrate 301. As the substrate 301, a semiconductor substrate such as a single crystal silicon substrate can be used, for example. The transistor 310 includes part of the substrate 301, a conductive layer 311, low-resistance regions 312, an insulating layer 313, and an insulating layer 314. The conductive layer 311 functions as a gate electrode. The insulating layer 313 is positioned between the substrate 301 and the conductive layer 311 and functions as a gate insulating layer. The low-resistance regions 312 are regions where the substrate 301 is doped with an impurity, and function as one of a source and a drain. The insulating layer 314 is provided to cover a side surface of the conductive layer 311.

An element isolation layer 315 is provided between two adjacent transistors 310 to be embedded in the substrate 301.

An insulating layer 261 is provided to cover the transistor 310, and the capacitor 240 is provided over the insulating layer 261.

The capacitor 240 includes a conductive layer 241, a conductive layer 245, and an insulating layer 243 positioned therebetween. The conductive layer 241 functions as one electrode of the capacitor 240, the conductive layer 245 functions as the other electrode of the capacitor 240, and the insulating layer 243 functions as a dielectric of the capacitor 240.

The conductive layer 241 is provided over the insulating layer 261 and is embedded in an insulating layer 254. The conductive layer 241 is electrically connected to one of the source and the drain of the transistor 310 through a plug 271 embedded in the insulating layer 261. The insulating layer 243 is provided to cover the conductive layer 241. The conductive layer 245 is provided in a region overlapping with the conductive layer 241 with the insulating layer 243 therebetween.

The insulating layer 255 is provided to cover the capacitor 240, and the light-emitting devices 130a, 130b, and 130c and the like are provided over the insulating layer 255. This embodiment shows an example in which the light-emitting devices 130a, 130b, and 130c have the same structure as the stacked-layer structure illustrated in FIG. 1B. The protective layer 131 is provided over the light-emitting devices 130a, 130b, and 130c. The protective layer 132 is provided over the protective layer 131, and the substrate 120 is bonded to the protective layer 132 with the resin layer 119. A region between the fourth electron-transport layer 116 and the electron-injection layer 114 is filled with the insulator 134. Embodiment 1 can be referred to for details of the light-emitting devices and the components thereover up to the substrate 120. The substrate 120 corresponds to the substrate 292 illustrated in FIG. 8A.

The pixel electrode of each of the light-emitting devices is electrically connected to one of the source and the drain of the transistor 310 through a plug 256 embedded in the insulating layer 255, the conductive layer 241 embedded in the insulating layer 254, and the plug 271 embedded in the insulating layer 261.

[Display Device 100B]

Figure 10:
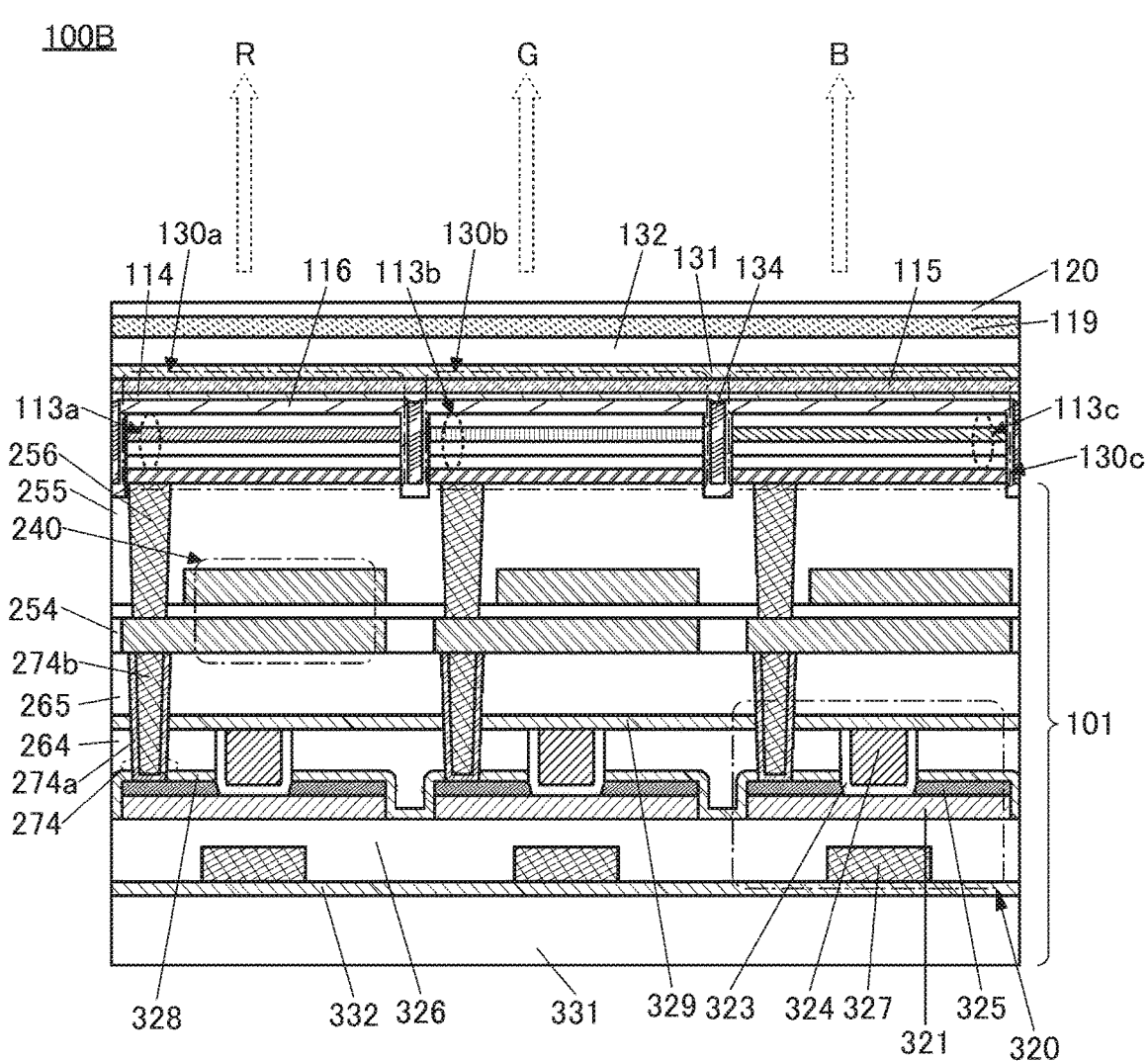
FIG. 10 is a cross-sectional view illustrating an example of a display device.

The display device 100B illustrated in FIG. 10 differs from the display device 100A mainly in a structure of a transistor. Note that portions similar to those in the display device 100A are not described in some cases.

A transistor 320 is a transistor that contains a metal oxide (also referred to as an oxide semiconductor) in a semiconductor layer where a channel is formed (i.e., an OS transistor).

The transistor 320 includes a semiconductor layer 321, an insulating layer 323, a conductive layer 324, a pair of conductive layers 325, an insulating layer 326, and a conductive layer 327.

A substrate 331 corresponds to the substrate 291 in FIG. 8A and FIG. 8B. A stacked-layer structure including the substrate 331 and the components thereover up to the insulating layer 255 corresponds to the layer 101 including transistors in Embodiment 1. As the substrate 331, an insulating substrate or a semiconductor substrate can be used.

An insulating layer 332 is provided over the substrate 331. The insulating layer 332 functions as a barrier layer that prevents diffusion of impurities such as water or hydrogen from the substrate 331 into the transistor 320 and release of oxygen from the semiconductor layer 321 to the insulating layer 332 side. As the insulating layer 332, it is possible to use, for example, a film in which hydrogen or oxygen is less likely to diffuse than in a silicon oxide film, such as an aluminum oxide film, a hafnium oxide film, or a silicon nitride film.

The conductive layer 327 is provided over the insulating layer 332, and the insulating layer 326 is provided to cover the conductive layer 327. The conductive layer 327 functions as a first gate electrode of the transistor 320, and part of the insulating layer 326 functions as a first gate insulating layer. An oxide insulating film such as a silicon oxide film is preferably used as at least part of the insulating layer 326 that is in contact with the semiconductor layer 321. A top surface of the insulating layer 326 is preferably planarized.

The semiconductor layer 321 is provided over the insulating layer 326. The semiconductor layer 321 preferably includes a film of a metal oxide having semiconductor characteristics (also referred to as an oxide semiconductor). A material that can be suitably used for the semiconductor layer 321 is described in detail later.

The pair of conductive layers 325 is provided on and in contact with the semiconductor layer 321, and functions as a source electrode and a drain electrode.

An insulating layer 328 is provided to cover top and side surfaces of the pair of conductive layers 325, a side surface of the semiconductor layer 321, and the like, and an insulating layer 264 is provided over the insulating layer 328. The insulating layer 328 functions as a barrier layer that prevents diffusion of impurities such as water or hydrogen from the insulating layer 264 and the like into the semiconductor layer 321 and release of oxygen from the semiconductor layer 321. As the insulating layer 328, an insulating film similar to the insulating layer 332 can be used.

An opening reaching the semiconductor layer 321 is provided in the insulating layer 328 and the insulating layer 264. The insulating layer 323, which is in contact with side surfaces of the insulating layer 264, the insulating layer 328, and the conductive layer 325 and a top surface of the semiconductor layer 321, and the conductive layer 324 are embedded in the opening. The conductive layer 324 functions as a second gate electrode, and the insulating layer 323 functions as a second gate insulating layer.

A top surface of the conductive layer 324, a top surface of the insulating layer 323, and a top surface of the insulating layer 264 are planarized so that they are substantially level with each other, and an insulating layer 329 and an insulating layer 265 are provided to cover these layers.

The insulating layer 264 and the insulating layer 265 each function as an interlayer insulating layer. The insulating layer 329 functions as a barrier layer that prevents diffusion of impurities such as water or hydrogen from the insulating layer 265 or the like to the transistor 320. As the insulating layer 329, an insulating film similar to the insulating layer 328 and the insulating layer 332 can be used.

A plug 274 electrically connected to one of the pair of conductive layers 325 is provided to be embedded in the insulating layer 265, the insulating layer 329, and the insulating layer 264. Here, the plug 274 preferably includes a conductive layer 274a that covers side surfaces of openings formed in the insulating layer 265, the insulating layer 329, the insulating layer 264, and the insulating layer 328 and part of a top surface of the conductive layer 325, and a conductive layer 274b in contact with a top surface of the conductive layer 274a. For the conductive layer 274a, a conductive material in which hydrogen and oxygen are less likely to diffuse is preferably used.

The layer 101 including transistors may include a variety of inorganic insulating films. As the inorganic insulating film, a silicon nitride film, a silicon oxynitride film, a silicon oxide film, a silicon nitride oxide film, an aluminum oxide film, or an aluminum nitride film can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above insulating films may also be used.

The structures of the insulating layer 254 and the components thereover up to the substrate 120 in the display device 100B are similar to those in the display device 100A.

[Display Device 100C]

Figure 11:
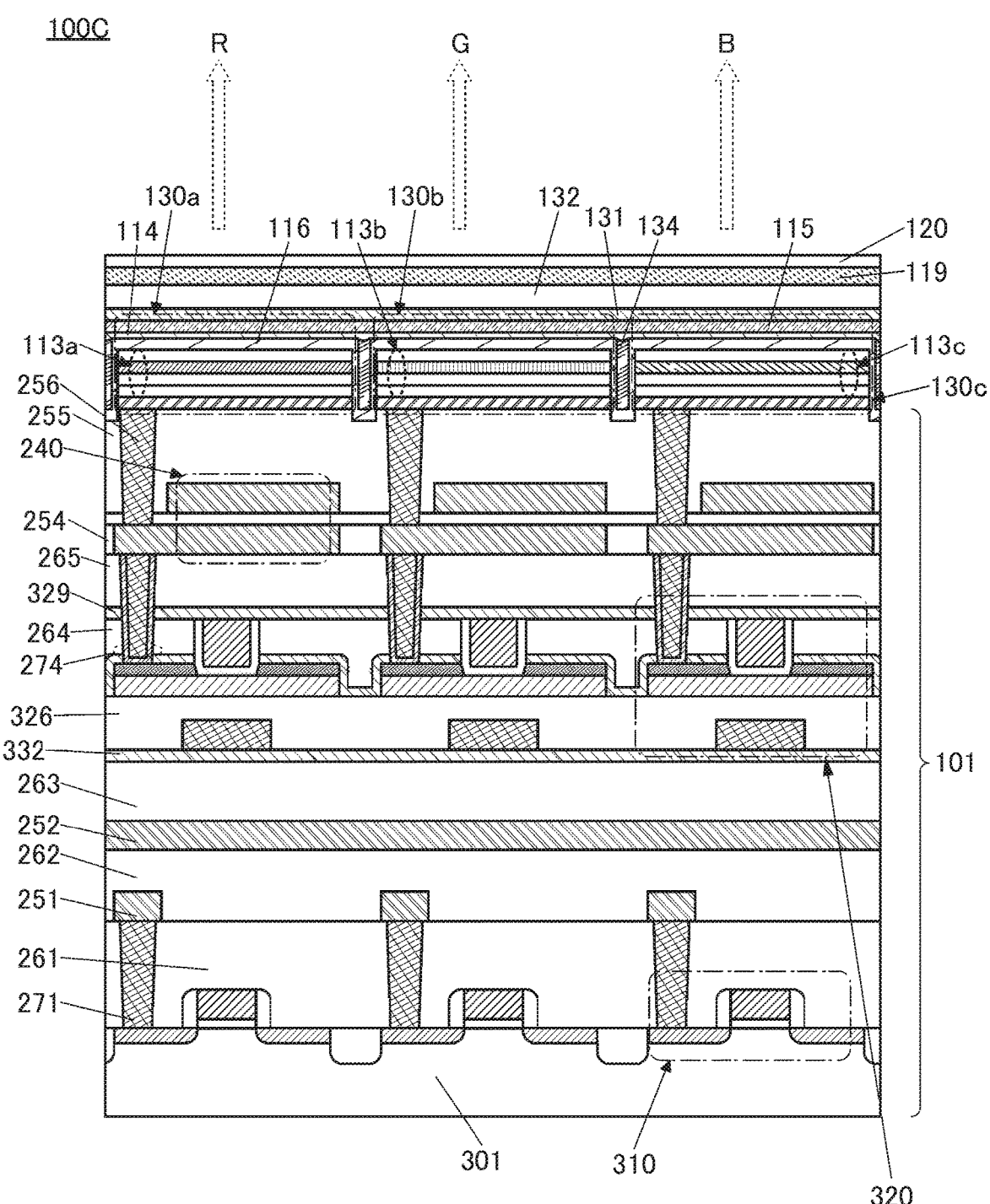
FIG. 11 is a cross-sectional view illustrating an example of a display device.

The display device 100C illustrated in FIG. 11 has a structure in which the transistor 310 having a channel formed in the substrate 301 and the transistor 320 including a metal oxide in a semiconductor layer where a channel is formed are stacked. Note that portions similar to those in the display devices 100A and 100B are not described in some cases.

The insulating layer 261 is provided to cover the transistor 310, and a conductive layer 251 is provided over the insulating layer 261. An insulating layer 262 is provided to cover the conductive layer 251, and a conductive layer 252 is provided over the insulating layer 262. The conductive layer 251 and the conductive layer 252 each function as a wiring. An insulating layer 263 and the insulating layer 332 are provided to cover the conductive layer 252, and the transistor 320 is provided over the insulating layer 332. The insulating layer 265 is provided to cover the transistor 320, and the capacitor 240 is provided over the insulating layer 265. The capacitor 240 and the transistor 320 are electrically connected to each other through the plug 274.

The transistor 320 can be used as a transistor included in the pixel circuit. The transistor 310 can be used as a transistor included in the pixel circuit or a transistor included in a driver circuit for driving the pixel circuit (a gate line driver circuit or a source line driver circuit). The transistor 310 and the transistor 320 can also be used as transistors included in a variety of circuits such as an arithmetic circuit and a memory circuit.

With such a structure, not only the pixel circuit but also the driver circuit and the like can be formed directly under the light-emitting devices; thus, the display device can be downsized as compared with the case where a driver circuit is provided around a display region.

This embodiment can be combined with the other embodiments as appropriate.

Embodiment 3

In this embodiment, a light-emitting device that can be used for the display device of one embodiment of the present invention is described.

Figures 12A, 12B, 12C, 12D:
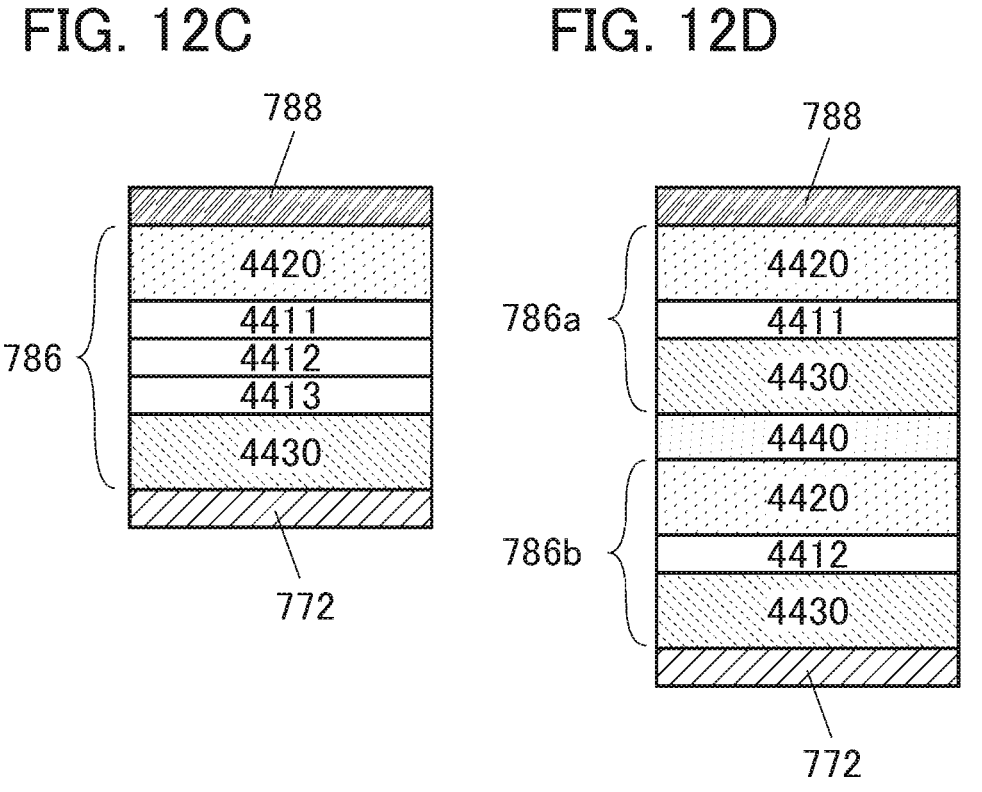
FIG. 12A to FIG. 12D are diagrams each illustrating a structure example of a light-emitting device.

A light-emitting device illustrated in FIG. 12A includes an electrode 772, an EL layer 786, and an electrode 788. One of the electrode 772 and the electrode 788 functions as an anode and the other functions as a cathode. One of the electrode 772 and the electrode 788 functions as a pixel electrode and the other functions as a common electrode. It is preferable that one of the electrode 772 and the electrode

788, through which light is extracted, transmit visible light and the other reflect visible light.

The EL layer 786 included in the light-emitting device can be formed of a plurality of layers such as a layer 4420, a light-emitting layer 4411, and a layer 4430, as illustrated in FIG. 12A. The layer 4420 can include, for example, a layer containing a substance with a high electron-injection property (an electron-injection layer) and a layer containing a substance with a high electron-transport property (an electron-transport layer). The light-emitting layer 4411 contains a light-emitting compound, for example. The layer 4430 can include, for example, a layer containing a substance with a high hole-injection property (a hole-injection layer) and a layer containing a substance with a high hole-transport property (a hole-transport layer).

The structure including the layer 4420, the light-emitting layer 4411, and the layer 4430, which is provided between a pair of electrodes, can serve as a single light-emitting unit, and the structure in FIG. 12A is referred to as a single structure in this specification.

FIG. 12B is a modification example of the EL layer 786 included in the light-emitting device illustrated in FIG. 12A. Specifically, the light-emitting device illustrated in FIG. 12B includes a layer 4431 over the electrode 772, a layer 4432 over the layer 4431, the light-emitting layer 4411 over the layer 4432, a layer 4421 over the light-emitting layer 4411, a layer 4422 over the layer 4421, and the electrode 788 over the layer 4422. For example, when the electrode 772 functions as an anode and the electrode 788 functions as a cathode, the layer 4431 functions as a hole-injection layer, the layer 4432 functions as a hole-transport layer, the layer 4421 functions as an electron-transport layer, and the layer 4422 functions as an electron-injection layer. Alternatively, when the electrode 772 functions as a cathode and the electrode 788 functions as an anode, the layer 4431 functions as an electron-injection layer, the layer 4432 functions as an electron-transport layer, the layer 4421 functions as a hole-transport layer, and the layer 4422 functions as the hole-injection layer. With such a layer structure, carriers can be efficiently injected to the light-emitting layer 4411, and the efficiency of the recombination of carriers in the light-emitting layer 4411 can be increased.

Note that the structure in which a plurality of light-emitting layers (light-emitting layers 4411, 4412, and 4413) are provided between the layer 4420 and the layer 4430 as illustrated in FIG. 12C is a variation of the single structure.

A structure in which a plurality of light-emitting units (EL layers 786a and 786b) are connected in series with an intermediate layer (also referred to as a charge-generation layer) 4440 therebetween as illustrated in FIG. 12D is referred to as a tandem structure in this specification. Note that one embodiment of the present invention is not limited thereto, and the tandem structure may be referred to as a stack structure. The tandem structure enables a light-emitting device capable of high-luminance light emission.

Note that also in FIG. 12C and FIG. 12D, the layer 4420 and the layer 4430 may each have a stacked-layer structure of two or more layers as illustrated in FIG. 12B.

The emission color of the light-emitting device can be red, green, blue, cyan, magenta, yellow, white, or the like depending on the material that constitutes the EL layer 786. Furthermore, the color purity can be further increased when the light-emitting device has a microcavity structure.

The light-emitting device that emits white light preferably contains two or more kinds of light-emitting substances in the light-emitting layer. To obtain white light emission, two or more light-emitting substances may be selected so that their emission colors are complementary. For example, when emission colors of a first light-emitting layer and a second light-emitting layer are complementary colors, the light-emitting device that emits white light as a whole can be obtained. The same applies to a light-emitting device including three or more light-emitting layers. For example, when the light-emitting layers 4411, 4412, and 4413 illustrated in FIG. 12C emit light of complementary colors, a white-light-emitting device with a single structure can be obtained.

The light-emitting layer preferably contains two or more light-emitting substances that emit light of R (red), G (green), B (blue), Y (yellow), 0 (orange), and the like. Alternatively, the light-emitting layer preferably contains two or more light-emitting substances that emit light containing two or more of color spectral components of R, G, and B.

This embodiment can be combined with the other embodiments as appropriate.

Embodiment 4

In this embodiment, a metal oxide (also referred to as an oxide semiconductor) that can be used in the OS transistor described in the above embodiment is described.

The metal oxide preferably contains at least indium or zinc. In particular, indium and zinc are preferably contained. In addition, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

The metal oxide can be formed by a sputtering method, a chemical vapor deposition (CVD) method such as a metal organic chemical vapor deposition (MOCVD) method, an atomic layer deposition (ALD) method, or the like.

<Classification of Crystal Structure>

Amorphous (including completely amorphous), CAAC (c-axis-aligned crystalline), nc (nanocrystalline), CAC (cloud-aligned composite), single-crystal, and polycrystalline (polycrystal) structures can be given as examples of a crystal structure of an oxide semiconductor.

Note that a crystal structure of a film or a substrate can be evaluated with an X-ray diffraction (XRD) spectrum. For example, evaluation is possible using an XRD spectrum which is obtained by GIXD (Grazing-Incidence XRD) measurement. Note that a GIXD method is also referred to as a thin film method or a Seemann—Bohlin method.

For example, the XRD spectrum of the quartz glass substrate shows a peak with a substantially bilaterally symmetrical shape. On the other hand, the peak of the XRD spectrum of the IGZO film having a crystal structure has a bilaterally asymmetrical shape. The asymmetrical peak of the XRD spectrum clearly shows the existence of crystal in the film or the substrate. In other words, the crystal structure of the film or the substrate cannot be regarded as "amorphous" unless it has a bilaterally symmetrical peak in the XRD spectrum.

A crystal structure of a film or a substrate can also be evaluated with a diffraction pattern obtained by a nanobeam electron diffraction (NBED) method (such a pattern is also referred to as a nanobeam electron diffraction pattern). For example, a halo pattern is observed in the diffraction pattern of the quartz glass substrate, which indicates that the quartz glass substrate is in an amorphous state. Furthermore, not a halo pattern but a spot-like pattern is observed in the diffraction pattern of the IGZO film deposited at room temperature. Thus, it is suggested that the IGZO film deposited at room temperature is in an intermediate state, which is neither a crystal state nor an amorphous state, and it cannot be concluded that the IGZO film is in an amorphous state.

<<Structure of Oxide Semiconductor>>

Oxide semiconductors might be classified in a manner different from the above-described one when classified in terms of the structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In—M—Zn oxide (the element M is one or more kinds selected from aluminum, gallium, yttrium, tin, titanium, and the like), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM (Transmission Electron Microscope) image, for example.

When the CAAC-OS film is subjected to structural analysis by Out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear crystal grain boundary (grain boundary) cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

Note that a crystal structure in which a clear crystal grain boundary is observed is what is called polycrystal. It is highly probable that the crystal grain boundary becomes a recombination center and captures carriers and thus decreases the on-state current and field-effect mobility of a transistor, for example. Thus, the CAAC-OS in which no clear crystal grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a crystal grain boundary as compared with an In oxide.

The CAAC-OS is an oxide semiconductor with high crystallinity in which no clear crystal grain boundary is observed. Thus, in the CAAC-OS, a reduction in electron mobility due to the crystal grain boundary is unlikely to occur. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods. For example, when an nc-OS film is subjected to structural analysis by Out-of-plane XRD measurement with an XRD apparatus using $\theta/2\theta$ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in a nanobeam electron diffraction pattern of the nc-OS film obtained using an electron beam with a probe diameter nearly equal to or smaller than the diameter of a nanocrystal (e.g., 1 nm or larger and 30 nm or smaller).

[a-like OS]

The a-like OS is an oxide semiconductor having a structure between those of the nc-OS and the amorphous oxide semiconductor. The a-like OS contains a void or a low-density region. That is, the a-like OS has lower crystallinity than the nc-OS and the CAAC-OS. Moreover, the a-like OS has higher hydrogen concentration in the film than the nc-OS and the CAAC-OS.

<<Structure of Oxide Semiconductor>>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Here, the atomic ratios of In, Ga, and Zn to the metal elements contained in the CAC-OS in an In—Ga—Zn oxide are denoted by [In], [Ga], and [Zn], respectively. For example, the first region in the CAC-OS in the In—Ga—Zn oxide has [In] higher than that in the composition of the CAC-OS. Moreover, the second region has [Ga] higher than that in the composition of the CAC-OS. For example, the first region has higher [In] and lower [Ga] than the second region. Moreover, the second region has higher [Ga] and lower [In] than the first region.

Specifically, the first region contains indium oxide, indium zinc oxide, or the like as its main component. The second region contains gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

In a material composition of a CAC-OS in an In—Ga—Zn oxide that contains In, Ga, Zn, and O, regions containing Ga as a main component are observed in part of the CAC-OS and regions containing In as a main component are observed in part thereof. These regions are randomly present to form a mosaic pattern. Thus, it is suggested that the CAC-OS has a structure in which metal elements are unevenly distributed.

The CAC-OS can be formed by a sputtering method under a condition where a substrate is not heated, for example. Moreover, in the case of forming the CAC-OS by a sputtering method, any one or more selected from an inert gas (typically, argon), an oxygen gas, and a nitrogen gas are used as a deposition gas. The ratio of the flow rate of an oxygen gas to the total flow rate of the deposition gas at the time of deposition is preferably as low as possible, and for example, the ratio of the flow rate of an oxygen gas to the total flow rate of the deposition gas at the time of deposition is preferably higher than or equal to 0% and less than 30%, further preferably higher than or equal to 0% and less than or equal to 10%.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

Here, the first region has a higher conductivity than the second region. In other words, when carriers flow through the first region, the conductivity of a metal oxide is exhibited. Accordingly, when the first regions are distributed in a metal oxide like a cloud, high field-effect mobility ($\mu$) can be achieved.

The second region has a higher insulating property than the first region. In other words, when the second regions are distributed in a metal oxide, leakage current can be inhibited.

Thus, in the case where a CAC-OS is used for a transistor, by the complementary action of the conductivity due to the first region and the insulating property due to the second region, the CAC-OS can have a switching function (On/Off function). That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current ($I_{on}$), high field-effect mobility ($\mu$), and excellent switching operation can be achieved.

A transistor using the CAC-OS has high reliability. Thus, the CAC-OS is most suitable for a variety of semiconductor devices such as display devices.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor having a low carrier concentration is preferably used in a transistor. For example, the carrier concentration of an oxide semiconductor is lower than or equal to $1\times10^{17}$ cm$^{-3}$, preferably lower than or equal to $1\times10^{15}$ cm$^{-3}$, further preferably lower than or equal to $1\times10^{13}$ cm$^{-3}$, still further preferably lower than or equal to $1\times10^{11}$ cm$^{-3}$, yet further preferably lower than $1\times10^{10}$ cm$^{-3}$, and higher than or equal to $1\times10^{-9}$ cm$^{-3}$. In order to reduce the carrier concentration in an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus has a low density of trap states in some cases.

Charge trapped by the trap states in the oxide semiconductor takes a long time to disappear and might behave like fixed charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurity>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the oxide semiconductor, which is obtained by SIMS, is set lower than or equal to $1\times10^{18}$ atoms/cm$^3$, preferably lower than or equal to $2\times10^{16}$ atoms/cm$^3$.

Furthermore, when the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, trap states are sometimes formed. This might make the electrical characteristics of the transistor unstable. Therefore, the concentration of nitrogen in the oxide semiconductor, which is obtained by SIMS, is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained by SIMS, is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for the channel formation region of the transistor, stable electrical characteristics can be given.

This embodiment can be combined with the other embodiments as appropriate.

Embodiment 5

In this embodiment, electronic devices of one embodiment of the present invention are described with reference to FIG. 13 to FIG. 17.

An electronic device of this embodiment is provided with the display device of one embodiment of the present invention in a display portion. The display device of one embodiment of the present invention can be easily increased in resolution and definition. Thus, the display device of one embodiment of the present invention can be used for a display portion of a variety of electronic devices.

Examples of electronic devices include a digital camera, a digital video camera, a digital photo frame, a mobile phone, a portable game console, a portable information terminal, and an audio reproducing device in addition to electronic devices with a relatively large screen, such as a television device, a desktop or laptop personal computer, a monitor of a computer or the like, digital signage, and a large game machine like a pachinko machine.

In particular, a display device of one embodiment of the present invention can have a high resolution, and thus can be favorably used for an electronic device having a relatively small display portion. Examples of such an electronic device include a watch-type or a bracelet-type information terminal device (wearable device), and a wearable device worn on a head, such as a device for VR such as a head mounted display, a glasses-type device for AR, and a device for MR.

The definition of the display device of one embodiment of the present invention is preferably as high as HD (number of pixels: 1280×720), FHD (number of pixels: 1920×1080), WQHD (number of pixels: 2560×1440), WQXGA (number of pixels: 2560×1600), 4K (number of pixels: 3840×2160), or 8K (number of pixels: 7680×4320). In particular, the definition is preferably 4K, 8K, or higher. Furthermore, the pixel density (resolution) of the display device of one embodiment of the present invention is preferably higher than or equal to 100 ppi, higher than or equal to 300 ppi, further preferably higher than or equal to 500 ppi, still further preferably higher than or equal to 1000 ppi, still further preferably higher than or equal to 2000 ppi, still further preferably higher than or equal to 3000 ppi, still further preferably higher than or equal to 5000 ppi, and yet further preferably higher than or equal to 7000 ppi. With the use of such a display device with high definition and high resolution, the electronic device can have higher realistic sensation, sense of depth, and the like in personal use such as portable use and home use. There is no particular limitation on the screen ratio (aspect ratio) of the display device of one embodiment of the present invention. For example, the display device is compatible with a variety of screen ratios such as 1:1 (a square), 4:3, 16:9, and 16:10.

The electronic device in this embodiment may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device in this embodiment can have a variety of functions. For example, the electronic device can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Examples of head-mounted wearable devices are described with reference to FIG. 13A, FIG. 13B, FIG. 14A, and FIG. 14B. These wearable devices have one or both of a function of displaying AR contents and a function of displaying VR contents. Note that these wearable devices may have a function of displaying SR or MR contents, in addition to AR and VR contents. The electronic device having a function of displaying contents of AR, VR, SR, MR, or the like enables the user to reach a higher level of immersion.

An electronic device 700A illustrated in FIG. 13A and an electronic device 700B illustrated in FIG. 13B each include a pair of display panels 751, a pair of housings 721, a communication portion (not illustrated), a pair of wearing portions 723, a control portion (not illustrated), an image capturing portion (not illustrated), a pair of optical members 753, a frame 757, and a pair of nose pads 758.

The display device of one embodiment of the present invention can be used for the display panel 751. Thus, the electronic device can perform display with extremely high resolution.

The electronic device 700A and the electronic device 700B can each project an image displayed on the display panel 751 onto display regions 756 of the optical members 753. Since the optical members 753 have a light-transmitting property, a user can see images displayed on the display regions, which are superimposed on transmission images seen through the optical members 753. Accordingly, the electronic device 700A and the electronic device 700B are electronic devices capable of AR display.

In the electronic device 700A and the electronic device 700B, a camera capable of capturing images of the front side may be provided as the image capturing portion. Furthermore, when the electronic device 700A and the electronic device 700B are provided with an acceleration sensor such as a gyroscope sensor, the orientation of the user's head can be detected and an image corresponding to the orientation can be displayed on the display region 756.

The communication portion includes a wireless communication device, and a video signal and the like can be supplied by the wireless communication device. Note that instead of or in addition to the wireless communication device, a connector to which a cable for supplying a video signal and/or a power supply potential can be connected may be provided.

The electronic device 700A and the electronic device 700B are provided with a battery so that they can be charged wirelessly and/or by wire.

A touch sensor module may be provided in the housing 721. The touch sensor module has a function of detecting a touch on the outer surface of the housing 721. A tap operation or a slide operation, for example, by the user can be detected with the touch sensor module, whereby a variety of processing can be executed. For example, processing such as a pause or a restart of a moving image can be executed by a tap operation, and processing such as fast forward and fast rewind can be executed by a slide operation. The touch sensor module is provided in each of the two housings 721, whereby the range of the operation can be increased.

A variety of touch sensors can be applied to the touch sensor module. Any of touch sensors of various types such as a capacitive type, a resistive type, an infrared type, an electromagnetic induction type, a surface acoustic wave type, and an optical type can be employed. In particular, a capacitive sensor or an optical sensor is preferably used for the touch sensor module.

In the case of using an optical touch sensor, a photoelectric conversion device (also referred to as a photoelectric conversion element) can be used as a light-receiving device (also referred to as a light-receiving element). One or both of an inorganic semiconductor and an organic semiconductor can be used for an active layer of the photoelectric conversion device.

An electronic device 800A illustrated in FIG. 14A and an electronic device 800B illustrated in FIG. 14B each include a pair of display portions 820, a housing 821, a communication portion 822, a pair of wearing portions 823, a control portion 824, a pair of image capturing portions 825, and a pair of lenses 832.

A display device of one embodiment of the present invention can be used in the display portions 820. Thus, the electronic device can perform display with extremely high resolution. This enables a user to feel high sense of immersion.

The display portions 820 are positioned inside the housing 821 so as to be seen through the lenses 832. When the pair of display portions 820 display different images, three-dimensional display using parallax can be performed.

The electronic device 800A and the electronic device 800B can be regarded as electronic devices for VR. The user who wears the electronic device 800A or the electronic device 800B can see images displayed on the display portions 820 through the lenses 832.

The electronic device 800A and the electronic device 800B preferably include a mechanism for adjusting the lateral positions of the lenses 832 and the display portions 820 so that the lenses 832 and the display portions 820 are positioned optimally in accordance with the positions of the user's eyes. Moreover, the electronic device 800A and the electronic device 800B preferably include a mechanism for adjusting focus by changing the distance between the lenses 832 and the display portions 820.

The electronic device 800A or the electronic device 800B can be mounted on the user's head with the wearing portions 823. FIG. 14A or the like illustrates an example in which the wearing portion 823 has a shape like a temple (also referred to as a joint or the like) of glasses; however, one embodiment of the present invention is not limited thereto. The wearing portion 823 can have any shape with which the user can wear the electronic device, for example, a shape of a helmet or a band.

The image capturing portion 825 has a function of obtaining information on the external environment. Data obtained by the image capturing portion 825 can be output to the display portion 820. An image sensor can be used for the image capturing portion 825. Moreover, a plurality of cameras may be provided so as to support a plurality of fields of view, such as a telescope field of view and a wide field of view.

Although an example of including the image capturing portion 825 is described here, a range sensor (hereinafter, also referred to as a sensing portion) that is capable of measuring a distance from an object may be provided. That is, the image capturing portion 825 is one embodiment of the sensing portion. As the sensing portion, an image sensor or a distance image sensor such as LIDAR (Light Detection and Ranging) can be used, for example. With the use of images obtained by the camera and images obtained by the distance image sensor, more pieces of information can be obtained and a gesture operation with higher accuracy is possible.

The electronic device 800A may include a vibration mechanism that functions as bone-conduction earphones. For example, a structure including the vibration mechanism can be applied to any one or more of the display portion 820, the housing 821, and the wearing portion 823. Thus, without additionally requiring an audio device such as headphones, earphones, or a speaker, the user can enjoy video and sound only by wearing the electronic device 800A.

The electronic device 800A and the electronic device 800B may each include an input terminal. To the input terminal, a cable for supplying a video signal from a video output device or the like, electric power for charging a battery provided in the electronic device, and the like can be connected.

The electronic device of one embodiment of the present invention may have a function of performing wireless communication with earphones 750. The earphones 750 include a communication portion (not illustrated) and have a wireless communication function. The earphones 750 can receive information (e.g., audio data) from the electronic device with the wireless communication function. For example, the electronic device 700A illustrated in FIG. 13A has a function of transmitting information to the earphones 750 with the wireless communication function. As another example, the electronic device 800A illustrated in FIG. 14A has a function of transmitting information to the earphones 750 with the wireless communication function.

The electronic device may include an earphone portion. The electronic device 700B illustrated in FIG. 13B includes earphone portions 727. For example, a structure in which the earphone portions 727 and the control portion are connected to each other by wire may be employed. Part of a wiring that connects the earphone portions 727 and the control portion may be positioned inside the housing 721 or the wearing portion 723.

Similarly, the electronic device 800B illustrated in FIG. 14B includes earphone portions 827. For example, a structure in which the earphone portions 827 and the control portion 824 are connected to each other by wire may be employed. Part of a wiring that connects the earphone portions 827 and the control portion 824 may be positioned inside the housing 821 or the wearing portion 823. The earphone portions 827 and the wearing portion 823 may include magnets. This is preferable because the earphone portions 827 can be fixed to the wearing portion 823 with magnetic force and thus can be easily housed.

Note that the electronic device may include an audio output terminal to which earphones, headphones, or the like can be connected. The electronic device may include one or both of an audio input terminal and an audio input mechanism. As the audio input mechanism, a sound collecting device such as a microphone can be used, for example. The electronic device may have a function of a headset by including the audio input mechanism.

As described above, both the glasses-type device (e.g., the electronic device 700A and the electronic device 700B) and the goggles-type device (e.g., the electronic device 800A and the electronic device 800B) are preferable as the electronic device of one embodiment of the present invention.

The electronic device of one embodiment of the present invention can transmit information to earphones by wire or wirelessly.

Figure 15A:
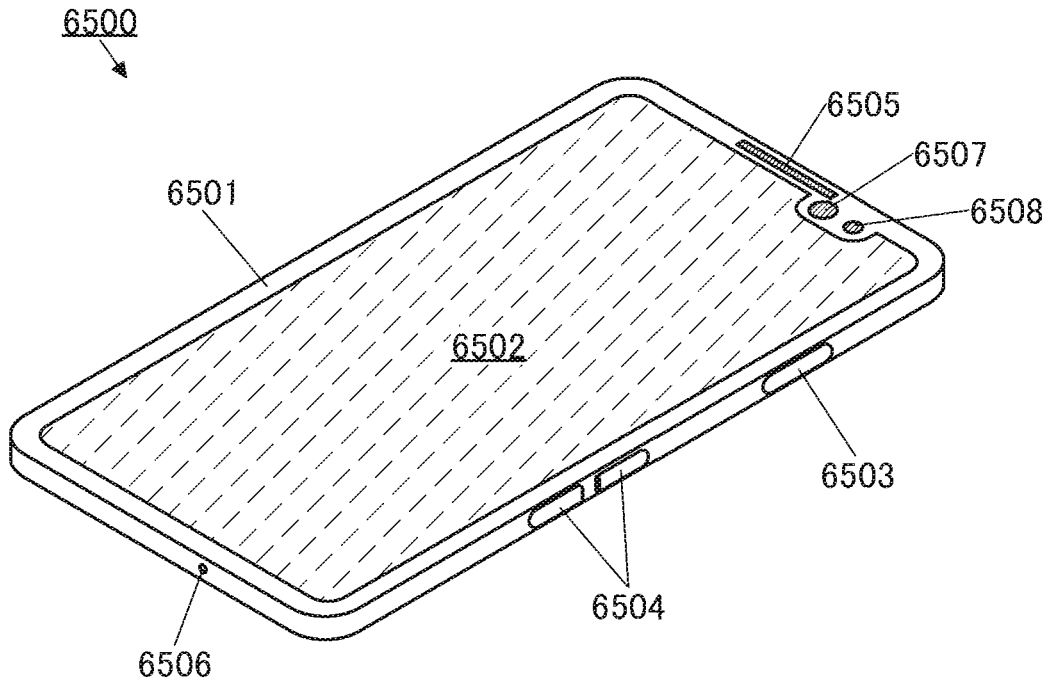
FIG. 15A and FIG. 15B are diagrams illustrating an example of an electronic device.

An electronic device 6500 illustrated in FIG. 15A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display device of one embodiment of the present invention can be used in the display portion 6502.

Figure 15B:
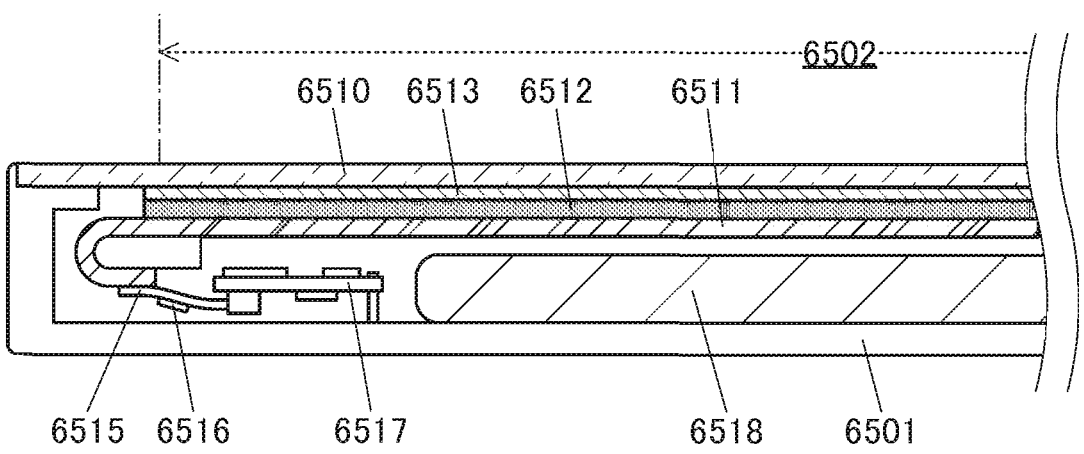

FIG. 15B is a schematic cross-sectional view including an end portion of the housing 6501 on the microphone 6506 side.

A protection member 6510 having a light-transmitting property is provided on a display surface side of the housing 6501, and a display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display of one embodiment of the present invention can be used as the display panel 6511. Thus, an extremely lightweight electronic device can be achieved. Since the display panel 6511 is extremely thin, the battery 6518 with high capacity can be mounted while the thickness of the electronic device is reduced. Moreover, part of the display panel 6511 is folded back so that a connection portion with the FPC 6515 is provided on the back side of the pixel portion, whereby an electronic device with a narrow bezel can be achieved.

Figures 16A, 16B, 16C, 16D:
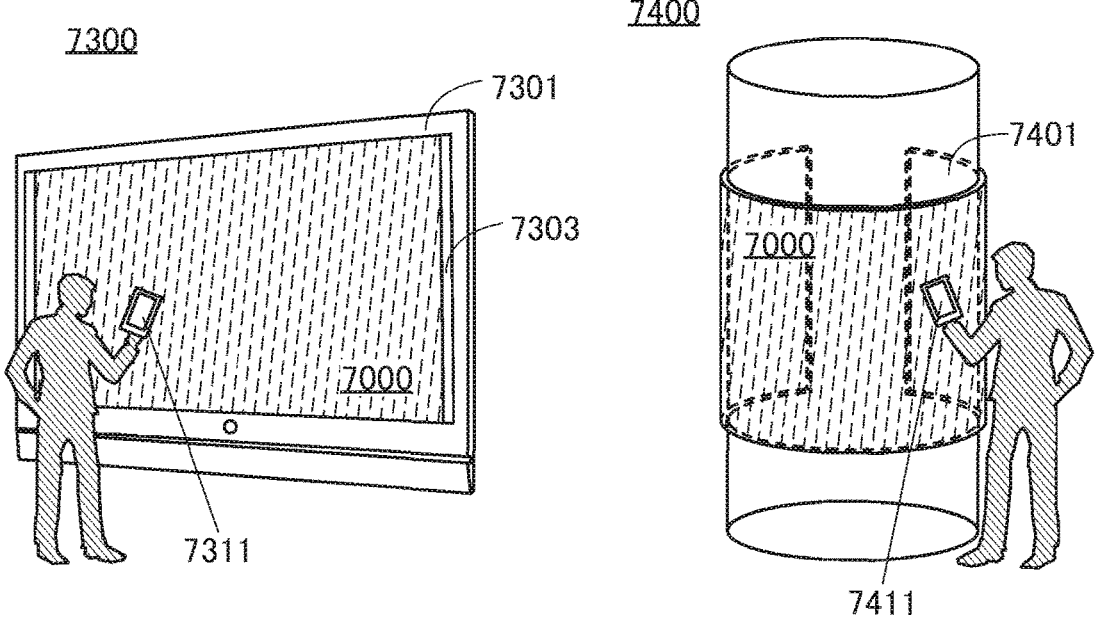
FIG. 16A to FIG. 16D are diagrams each illustrating an example of an electronic device.

FIG. 16A illustrates an example of a television device. In a television device 7100, a display portion 7000 is incorporated in a housing 7101. Here, the housing 7101 is supported by a stand 7103.

The display device of one embodiment of the present invention can be used for the display portion 7000.

Operation of the television device 7100 illustrated in FIG. 16A can be performed with an operation switch provided in the housing 7101 and a separate remote controller 7111. Alternatively, the display portion 7000 may include a touch sensor, and the television device 7100 may be operated by touch on the display portion 7000 with a finger or the like. The remote controller 7111 may be provided with a display portion for displaying information output from the remote controller 7111. With operation keys or a touch panel provided in the remote controller 7111, channels and volume can be operated and videos displayed on the display portion 7000 can be operated.

Note that the television device 7100 has a structure in which a receiver, a modem, and the like are provided. A general television broadcast can be received with the receiver. When the television device is connected to a communication network with or without wires via the modem, one-way (from a transmitter to a receiver) or two-way (between a transmitter and a receiver or between receivers, for example) data communication can be performed.

FIG. 16B illustrates an example of a laptop personal computer. The laptop personal computer 7200 includes a housing 7211, a keyboard 7212, a pointing device 7213, an external connection port 7214, and the like. In the housing 7211, the display portion 7000 is incorporated.

The display device of one embodiment of the present invention can be used for the display portion 7000.

FIG. 16C and FIG. 16D illustrate examples of digital signage.

Digital signage 7300 illustrated in FIG. 16C includes a housing 7301, the display portion 7000, a speaker 7303, and the like. The digital signage 7300 can also include an LED lamp, an operation key (including a power switch or an operation switch), a connection terminal, a variety of sensors, a microphone, and the like.

FIG. 16D is digital signage 7400 attached to a cylindrical pillar 7401. The digital signage 7400 includes the display portion 7000 provided along a curved surface of the pillar 7401.

The display device of one embodiment of the present invention can be used for the display portion 7000 in FIG. 16C and FIG. 16D.

A larger area of the display portion 7000 can increase the amount of information that can be provided at a time. The larger display portion 7000 attracts more attention, so that the effectiveness of the advertisement can be increased, for example.

The use of a touch panel in the display portion 7000 is preferable because in addition to display of a still image or a moving image on the display portion 7000, intuitive operation by a user is possible. Moreover, for an application for providing information such as route information or traffic information, usability can be enhanced by intuitive operation.

As illustrated in FIG. 16C and FIG. 16D, it is preferable that the digital signage 7300 or the digital signage 7400 can work with an information terminal 7311 or an information terminal 7411 such as a smartphone a user has through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with use of the screen of the information terminal 7311 or the information terminal 7411 as an operation means (controller). Thus, an unspecified number of users can join in and enjoy the game concurrently.

Electronic devices illustrated in FIG. 17A to FIG. 17F each include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The display device of one embodiment of the present invention can be used for the display portion 9001 in FIG. 17A to FIG. 17F.

The electronic devices illustrated in FIG. 17A to FIG. 17F have a variety of functions. For example, the electronic devices can have a function of displaying a variety of information (a still image, a moving image, a text image, and the like) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may each include a plurality of display portions. The electronic devices may each be provided with a camera or the like and have a function of taking a still image or a moving image, a function of storing the taken image in a storage medium (an external storage medium or a storage medium incorporated in the camera), a function of displaying the taken image on the display portion, or the like.

The electronic devices illustrated in FIG. 17A to FIG. 17F are described in detail below.

Figure 17A:
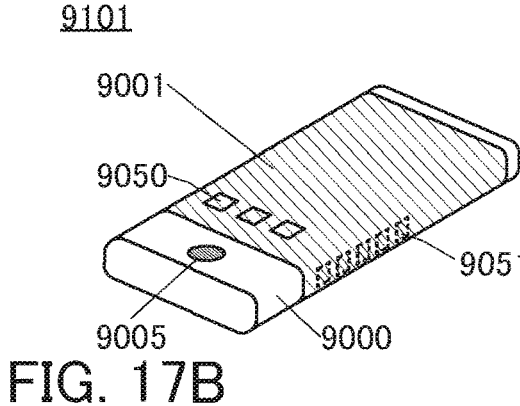
FIG. 17A to FIG. 17F are diagrams each illustrating an example of an electronic device.

FIG. 17A is a perspective view showing a portable information terminal 9101. For example, the portable information terminal 9101 can be used as a smartphone. Note that the portable information terminal 9101 may include the speaker 9003, the connection terminal 9006, the sensor 9007, or the like. The portable information terminal 9101 can display characters and image information on its plurality of surfaces. FIG. 17A illustrates an example in which three icons 9050 are displayed. Furthermore, information 9051 indicated by dashed rectangles can be displayed on another surface of the display portion 9001. Examples of the information 9051 include notification of reception of an e-mail, an SNS message, or an incoming call, the title and sender of an e-mail, an SNS message, or the like, the date, the time, remaining battery, and the radio field intensity. Alternatively, the icon 9050 or the like may be displayed at the position where the information 9051 is displayed.

Figure 17B:
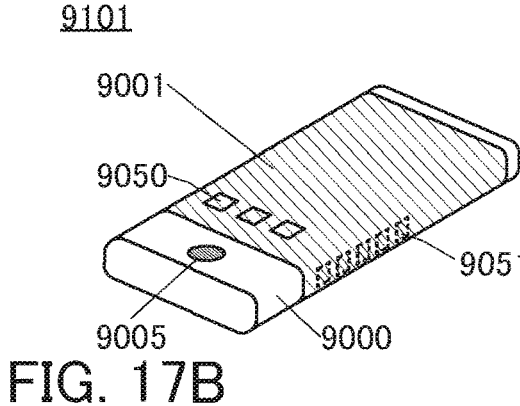

FIG. 17B is a perspective view showing a portable information terminal 9102. The portable information terminal 9102 has a function of displaying information on three or more surfaces of the display portion 9001. Shown here is an example in which information 9052, information 9053, and information 9054 are displayed on different surfaces. For example, a user of the portable information terminal 9102 can check the information 9053 displayed such that it can be seen from above the portable information terminal 9102, with the portable information terminal 9102 put in a breast pocket of his/her clothes. The user can see the display without taking out the portable information terminal 9102 from the pocket and decide whether to answer the call, for example.

Figure 17C:
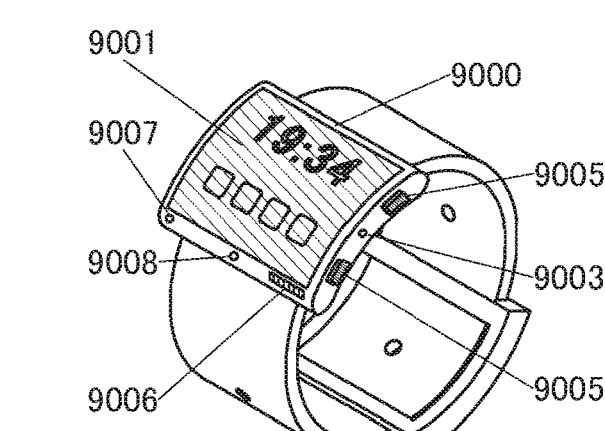

FIG. 17C is a perspective view illustrating a watch-type portable information terminal 9200. For example, the portable information terminal 9200 can be used as a Smartwatch (registered trademark). The display surface of the display portion 9001 is curved, and an image can be displayed on the curved display surface. Furthermore, intercommunication between the portable information terminal 9200 and, for example, a headset capable of wireless communication enables hands-free calling. With the connection terminal 9006, the portable information terminal 9200 can perform mutual data transmission with another information terminal and charging. Note that the charging operation may be performed by wireless power feeding.

Figure 17D:
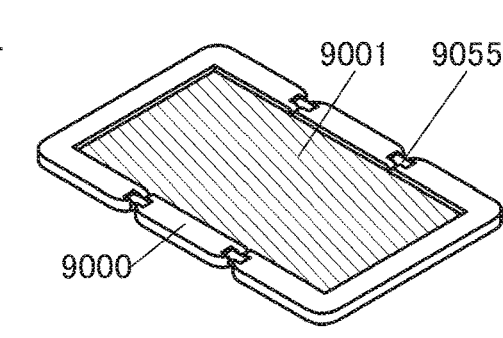
Figure 17E:
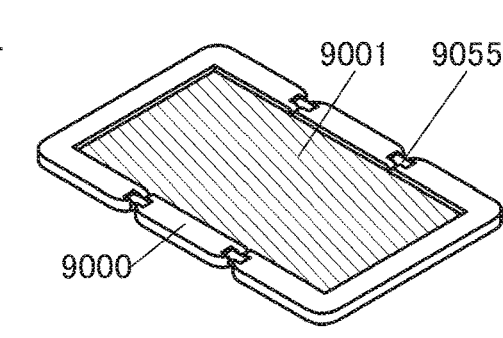
Figure 17F:
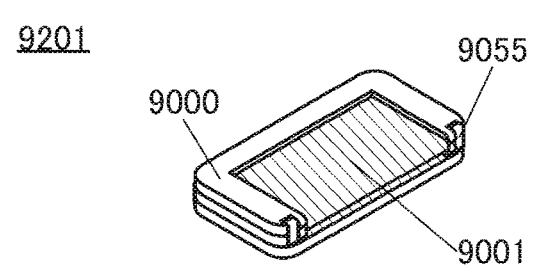

FIG. 17D to FIG. 17F are perspective views illustrating a foldable portable information terminal 9201. FIG. 17D is a perspective view of an opened state of the portable information terminal 9201, FIG. 17F is a perspective view of a folded state thereof, and FIG. 17E is a perspective view of a state in the middle of change from one of FIG. 17D and FIG. 17F to the other. The portable information terminal 9201 is highly portable when folded. When the portable information terminal 9201 is opened, a seamless large display region is highly browsable. The display portion 9001 of the portable information terminal 9201 is supported by three housings 9000 joined together by hinges 9055. The display portion 9001 can be folded with a radius of curvature of greater than or equal to 0.1 mm and less than or equal to 150 mm, for example.

This embodiment can be combined with the other embodiments as appropriate.

REFERENCE NUMERALS

100A: display device, 100B: display device, 100C: display device, 100: display device, 101: layer including transistor, 110a: subpixel, 110b: subpixel, 110c: subpixel, 110: pixel, 111a: pixel electrode, 111b: pixel electrode, 111c: pixel electrode, 111: conductive film, 113a: first layer, 113b: second layer, 113c: third layer, 114: electron-injection layer, 115: common electrode, 116: fourth electron-transport layer, 118A: first sacrificial layer, 118a: first sacrificial layer, 118B: second sacrificial layer, 118b: second sacrificial layer, 118C: third sacrificial layer, 118c: third sacrificial layer, 119: resin layer, 120: substrate, 123: conductive layer, 130a: light-emitting device, 130b: light-emitting device, 130c: light-emitting device, 131: protective layer, 132: protective layer, 133: space, 134: insulator, 140: connection portion, 181A: first hole-injection layer, 181a: first hole-injection layer, 181B: second hole-injection layer, 181b: second hole-injection layer, 181C: third hole-injection layer, 181c: third hole-injection layer, 182A: first hole-transport layer, 182a: first hole-transport layer, 182B: second hole-transport layer, 182b: second hole-transport layer, 182C: third hole-transport layer, 182c: third hole-transport layer, 183A: first light-emitting layer, 183a: first light-emitting layer, 183B: second light-emitting layer, 183b: second light-emitting layer, 183C: third light-emitting layer, 183c: third light-emitting layer, 184A: first electron-transport layer, 184a: first electron-transport layer, 184B: second electron-transport layer, 184b: second electron-transport layer, 184C: third electron-transport layer, 184c: third electron-transport layer, 190a: resist mask, 190b: resist mask, 190c: resist mask, 240: capacitor, 241: conductive layer, 243: insulating layer, 245: conductive layer, 251: conductive layer, 252: conductive layer,

254: insulating layer, 255: insulating layer, 256: plug, 261: insulating layer, 262: insulating layer, 263: insulating layer, 264: insulating layer, 265: insulating layer, 271: plug, 274a: conductive layer, 274b: conductive layer, 274: plug, 280: display module, 281: display portion, 282: circuit portion, 283a: pixel circuit, 283: pixel circuit portion, 284a: pixel, 284: pixel portion, 285: terminal portion, 286: wiring portion, 290: FPC, 291: substrate, 292: substrate, 301: substrate, 310: transistor, 311: conductive layer, 312: low-resistance region, 313: insulating layer, 314: insulating layer, 315: element isolation layer, 320: transistor, 321: semiconductor layer, 323: insulating layer, 324: conductive layer, 325: conductive layer, 326: insulating layer, 327: conductive layer, 328: insulating layer, 329: insulating layer, 331: substrate, 332: insulating layer, 700A: electronic device, 700B: electronic device, 721: housing, 723: wearing portion, 727: earphone portion, 750: earphone, 751: display panel, 753: optical member, 756: display region, 757: frame, 758: nose pad, 772: electrode, 786a: EL layer, 786b: EL layer, 786: EL layer, 788: electrode, 800A: electronic device, 800B: electronic device, 820: display portion, 821: housing, 822: communication portion, 823: wearing portion, 824: control portion, 825: image capturing portion, 827: earphone portion, 832: lens, 4411: light-emitting layer, 4412: light-emitting layer, 4413: light-emitting layer, 4420: layer, 4421: layer, 4422: layer, 4430: layer, 4431: layer, 4432: layer, 4440: intermediate layer, 6500: electronic device, 6501: housing, 6502: display portion, 6503: power button, 6504: button, 6505: speaker, 6506: microphone, 6507: camera, 6508: light source, 6510: protection member, 6511: display panel, 6512: optical member, 6513: touch sensor panel, 6515: FPC, 6516: IC, 6517: printed circuit board, 6518: battery, 7000: display portion, 7100: television device, 7101: housing, 7103: stand, 7111: remote controller, 7200: laptop personal computer, 7211: housing, 7212: keyboard, 7213: pointing device, 7214: external connection port, 7300: digital signage, 7301: housing, 7303: speaker, 7311: information terminal, 7400: digital signage, 7401: pillar, 7411: information terminal, 9000: housing, 9001: display portion, 9003: speaker, 9005: operation key, 9006: connection terminal, 9007: sensor, 9008: microphone, 9050: icon, 9051: information, 9052: information, 9053: information, 9054: information, 9055: hinge, 9101: portable information terminal, 9102: portable information terminal, 9200: portable information terminal, 9201: portable information terminal

The invention claimed is:

1. A display device comprising:
 a first light-emitting device; and
 a second light-emitting device,
 wherein the first light-emitting device comprises:
  a first pixel electrode;
  a first hole-injection layer over the first pixel electrode;
  a first hole-transport layer over the first hole-injection layer;
  a first light-emitting layer over the first hole-transport layer;
  a first electron-transport layer over the first light-emitting layer;
  a second electron-transport layer over the first electron-transport layer;
  an electron-injection layer over the second electron-transport layer; and a common electrode over the electron-injection layer,
wherein the second light-emitting device comprises:

a second pixel electrode;

a second hole-injection layer over the second pixel electrode;

a second hole-transport layer over the second hole-injection layer;

a second light-emitting layer over the second hole-transport layer;

a third electron-transport layer over the second light-emitting layer;

the second electron-transport layer over the third electron-transport layer;

the electron-injection layer over the second electron-transport layer; and the common electrode over the electron-injection layer, wherein the first light-emitting device and the second light-emitting device are configured to emit light of different colors from each other, and wherein the second electron-transport layer covers at least a side surface of the first pixel electrode, a side surface of the second pixel electrode, a side surface of the first light-emitting layer, and a side surface of the second light-emitting layer.

2. The display device according to claim 1, further comprising:

a protective layer over the common electrode.

3. The display device according to claim 1, wherein the first light-emitting device and the second light-emitting device are provided over an insulating layer, wherein the insulating layer includes a recessed portion, and wherein the second electron-transport layer is in contact with the recessed portion.

4. The display device according to claim 1, wherein a space is included between the second electron-transport layer and the electron-injection layer.

5. The display device according to claim 1, wherein an insulator is included between the second electron-transport layer and the electron-injection layer.

6. A display module comprising:

the display device according to claim 1; and at least one of a connector and an integrated circuit.

7. An electronic device comprising:

the display module according to claim 6; and at least one of a housing, a battery, a camera, a speaker, and a microphone.

8. A method for manufacturing a display device, comprising:

forming an insulating layer;

forming a conductive film over the insulating layer;

forming a first hole-injection layer over the conductive film;

forming a first hole-transport layer over the first hole-injection layer;

forming a first light-emitting layer over the first hole-transport layer;

forming a first electron-transport layer over the first light-emitting layer;

forming a first sacrificial layer over the first electron-transport layer;

processing the first hole-injection layer, the first hole-transport layer, the first light-emitting layer, the first electron-transport layer, and the first sacrificial layer to expose part of the conductive film;

forming a second hole-injection layer over the first sacrificial layer and the conductive film;

forming a second hole-transport layer over the second hole-injection layer;

forming a second light-emitting layer over the second hole-transport layer;

forming a second electron-transport layer over the second light-emitting layer;

forming a second sacrificial layer over the second electron-transport layer;

processing the second hole-injection layer, the second hole-transport layer, the second light-emitting layer, the second electron-transport layer, and the second sacrificial layer to expose part of the conductive film;

processing the conductive film with the first sacrificial layer and the second sacrificial layer used as a hard mask to form a first pixel electrode overlapping with the first sacrificial layer and a second pixel electrode overlapping with the second sacrificial layer;

removing the first sacrificial layer and the second sacrificial layer;

forming a third electron-transport layer over the first electron-transport layer and the second electron-transport layer;

forming an electron-injection layer over the third electron-transport layer; and forming a common electrode over the electron-injection layer.

9. The method for manufacturing a display device, according to claim 8, further comprising:

forming a protective layer over the common electrode.

10. The method for manufacturing a display device, according to claim 8, wherein the third electron-transport layer is provided so as to cover at least a side surface of the first pixel electrode, a side surface of the second pixel electrode, a side surface of the first light-emitting layer, and a side surface of the second light-emitting layer.

11. The method for manufacturing a display device, according to claim 8, wherein a recessed portion of the third electron-transport layer is filled with an insulating material before the formation of the electron-injection layer.

12. The method for manufacturing a display device, according to claim 8, wherein in the step of processing the conductive film, a recessed portion is formed in the insulating layer.

* * * * *